(12) United States Patent
Yeh et al.

(10) Patent No.: US 6,891,220 B2
(45) Date of Patent: May 10, 2005

(54) METHOD OF PROGRAMMING ELECTRONS ONTO A FLOATING GATE OF A NON-VOLATILE MEMORY CELL

(75) Inventors: Bing Yeh, Los Altos Hills, CA (US); Sohrab Kianian, Los Altos Hills, CA (US); Yaw Wen Hu, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/757,830

(22) Filed: Jan. 13, 2004

(65) Prior Publication Data

US 2004/0183121 A1 Sep. 23, 2004

Related U.S. Application Data

(63) Continuation-in-part of application No. 10/358,623, filed on Feb. 4, 2003.
(60) Provisional application No. 60/370,888, filed on Apr. 5, 2002, provisional application No. 60/393,696, filed on Jul. 2, 2002, and provisional application No. 60/398,146, filed on Jul. 23, 2002.

(51) Int. Cl.$^7$ .............................................. H01L 29/76
(52) U.S. Cl. ....................... 257/314; 257/261; 257/315; 257/321; 257/322; 365/185.01; 365/185.05; 365/185.27; 365/185.28; 365/185.33
(58) Field of Search ................................ 257/239, 261, 257/295, 298, 314–326; 365/185.01, 185.05, 185.27, 185.28, 185.33

(56) References Cited

U.S. PATENT DOCUMENTS

| | | |
|---|---|---|
| 4,757,360 A | 7/1988 | Farone |
| 4,794,565 A | 12/1988 | Wu et al. |

(Continued)

FOREIGN PATENT DOCUMENTS

EP   0 389 721 A2   10/1990

OTHER PUBLICATIONS

Hayashi, Fumihiko and Plummer, James D., "A Self–Aligned Split–Gate Flash EEPROM Cell With 3–D Pillar Structure", 1999 Symposium on VLSI Technology Digest of Technical Papers, Center for Integrated System, Stanford University, Stanford, CA 94305, USA, pp. 87–88.

(Continued)

*Primary Examiner*—Andy Huynh
(74) *Attorney, Agent, or Firm*—DLA Piper Rudnick Gray Cary US LLP

(57) ABSTRACT

A memory cell has a trench formed into a surface of a semiconductor substrate, and spaced apart source and drain regions with a channel region formed therebetween. The source region is formed underneath the trench, and the channel region includes a first portion extending vertically along a sidewall of the trench and a second portion extending horizontally along the substrate surface. An electrically conductive floating gate is disposed in the trench adjacent to and insulated from the channel region first portion. An electrically conductive control gate is disposed over and insulated from the channel region second portion. A block of conductive material has at least a lower portion thereof disposed in the trench adjacent to and insulated from the floating gate, and can be electrically connected to the source region. A method of programming the cell comprises the steps of creating an inversion layer in the second portion of the channel. A stream of electrons is generated at the drain region which is adjacent to the inversion layer, and the stream of electrons is passed through the inversion layer, reaching a pinch off point. The electrons are accelerated through the depletion region by the field lines from the floating gate, with little or no scattering, causing the electrons to be accelerated through the insulator, separating the floating gate from the substrate, and injected onto the floating gate.

5 Claims, 16 Drawing Sheets

U.S. PATENT DOCUMENTS

| | | |
|---|---|---|
| 4,882,707 A | 11/1989 | Mizutani |
| 4,905,062 A | 2/1990 | Esquivel et al. |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,049,515 A | 9/1991 | Tzeng |
| 5,101,250 A | 3/1992 | Arima et al. |
| 5,268,319 A | 12/1993 | Harari |
| 5,338,953 A | 8/1994 | Wake |
| 5,381,028 A | 1/1995 | Iwasa |
| 5,429,965 A | 7/1995 | Shimoji |
| 5,495,441 A | 2/1996 | Hong |
| 5,544,103 A | 8/1996 | Lambertson |
| 5,572,054 A | 11/1996 | Wang et al. |
| 5,638,320 A * | 6/1997 | Wong et al. ........... 365/185.03 |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 5,943,572 A | 8/1999 | Krautschneider |
| 6,091,104 A | 7/2000 | Chen |
| 6,103,573 A | 8/2000 | Harari et al. |
| 6,140,182 A | 10/2000 | Chen |
| 6,157,058 A * | 12/2000 | Ogura ........................ 257/315 |
| 6,180,458 B1 | 1/2001 | Krautschneider et al. |
| 6,222,227 B1 | 4/2001 | Chen |
| 6,262,917 B1 | 7/2001 | Lee |
| 6,316,298 B1 | 11/2001 | Lee |
| 6,316,315 B1 | 11/2001 | Hofmann et al. |
| 6,521,944 B1 | 2/2003 | Mirgorodski |
| 6,525,371 B2 | 2/2003 | Johnson |
| 6,538,275 B2 | 3/2003 | Sugiyama et al. |
| 6,541,815 B1 | 4/2003 | Mandelman et al. |
| 6,756,633 B2 | 6/2004 | Wang et al. |
| 2003/0073275 A1 | 4/2003 | Kianian et al. |

OTHER PUBLICATIONS

Sze, Simon, "Physics of Semiconductor Devices", 2nd Edition, Wiley–Interscience, Basic Device Characteristics pp. 438–439.

Brown, William D. et al.; "Nonvolatile Semiconductor Memory Technology, A Comprehensive Guide to Understanding And Using NVSM Devices", IEEE Press, pp. 33–34.

U.S. Appl. No. 10/358,601, filed Feb. 2003, Kianian.
U.S. Appl. No. 10/358,623, filed Feb. 2003, Hu et al.
U.S. Appl. No. 10/653,015, filed Aug. 2003, Chen et al.
Physics of Semiconductor Devices, 2d Edition, Wiley–Interscience, "Basic Device Characteristics," pp. 438–439.
IEEE Press, Brown et al, "Nonvolatile Semiconductor Memory Technology," pp. 33–34.

* cited by examiner

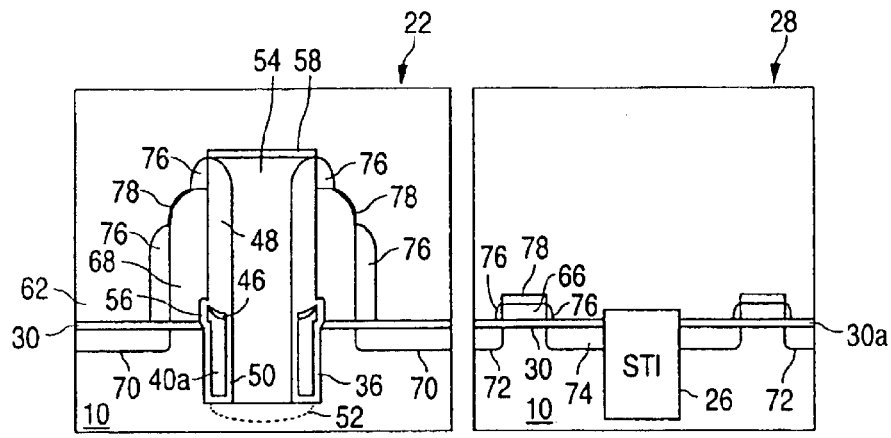
FIG. 2P   FIG. 3P
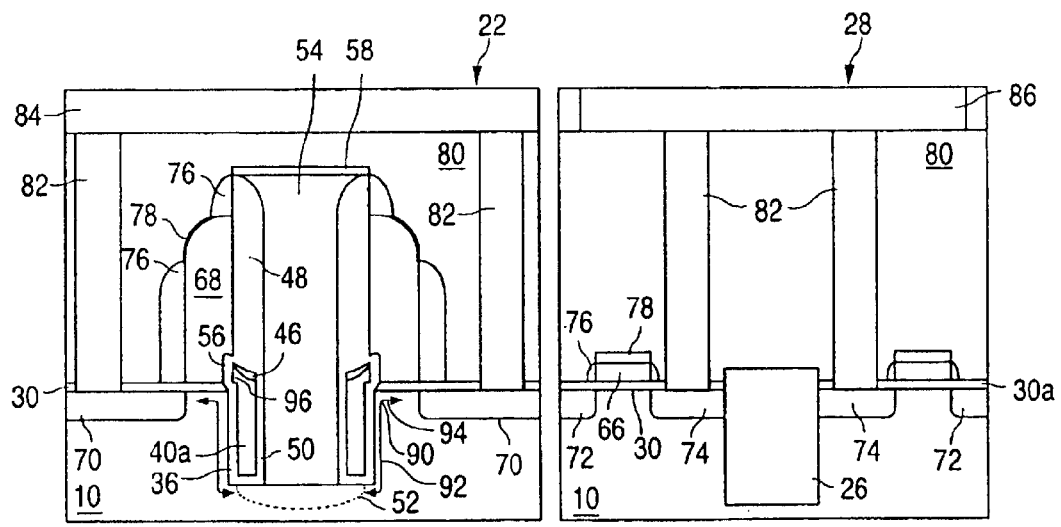
FIG. 2Q   FIG. 3Q

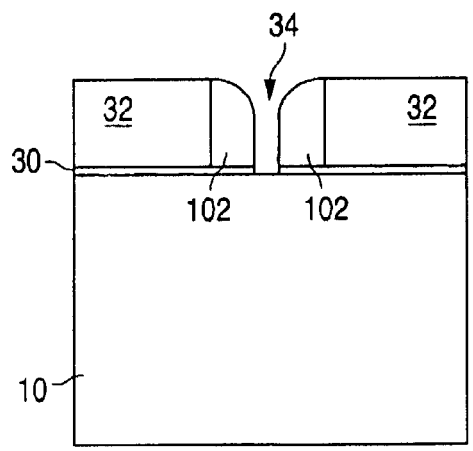
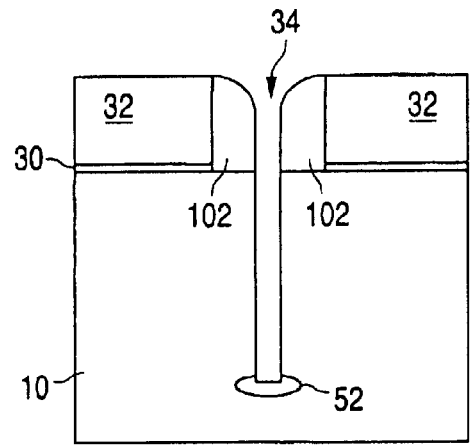
FIG. 5A  FIG. 5B
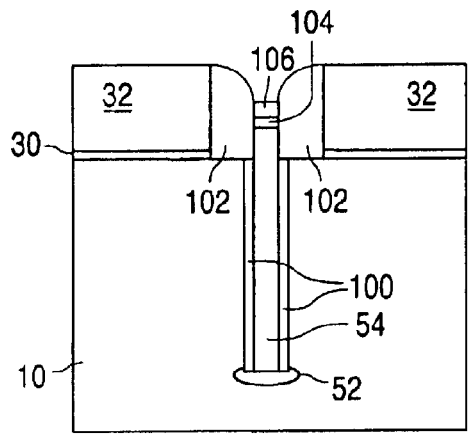
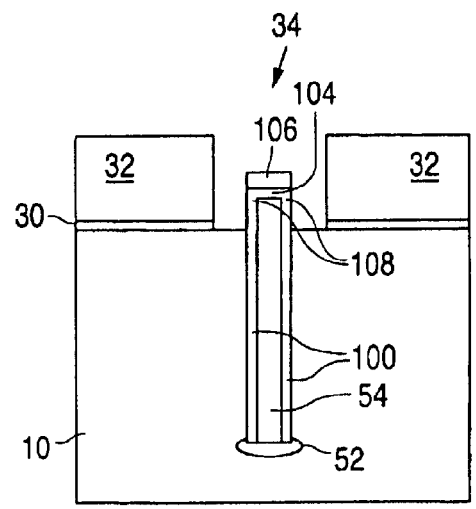
FIG. 5C  FIG. 5D
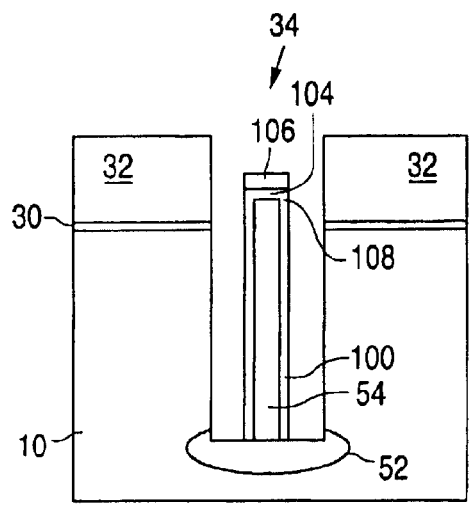
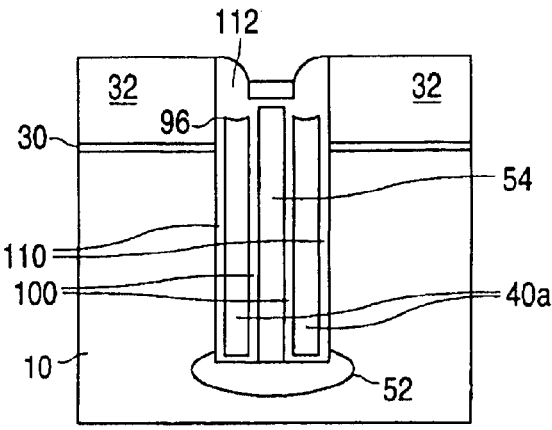
FIG. 5E  FIG. 5F

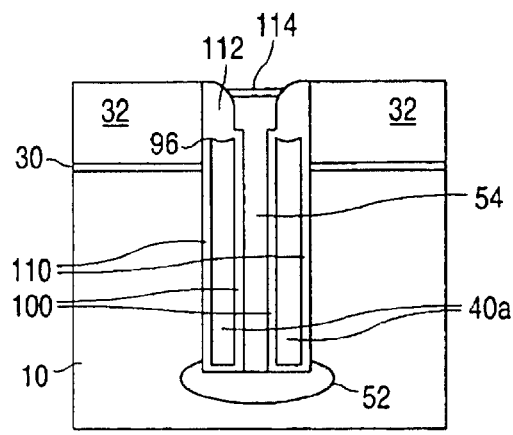
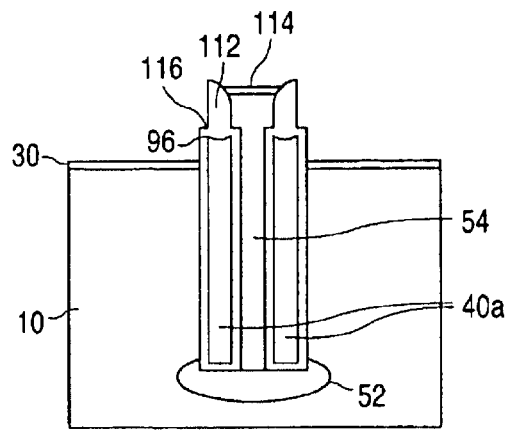
FIG. 5G    FIG. 5H
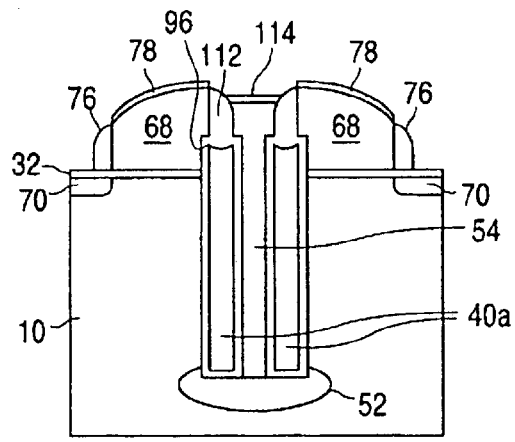
FIG. 5I
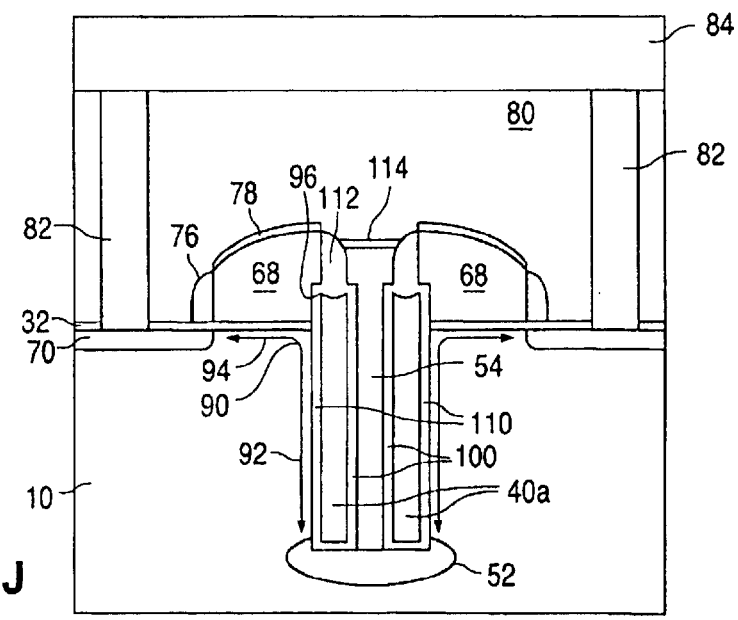
FIG. 5J

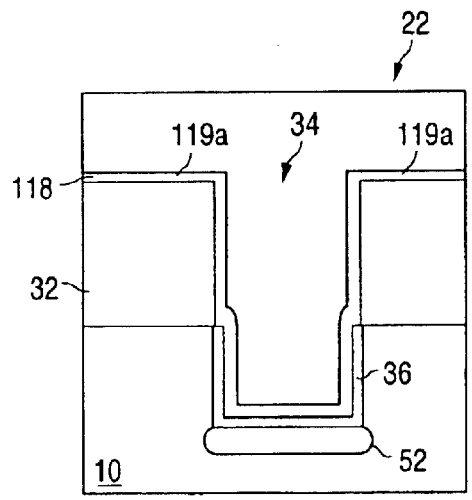
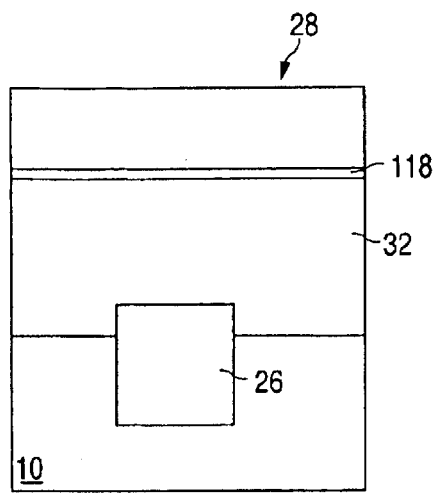
FIG. 6A  FIG. 7A
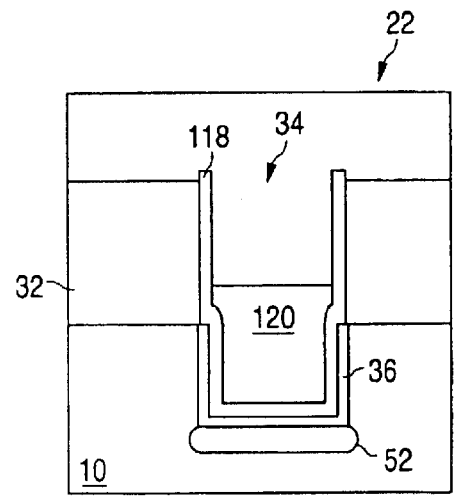
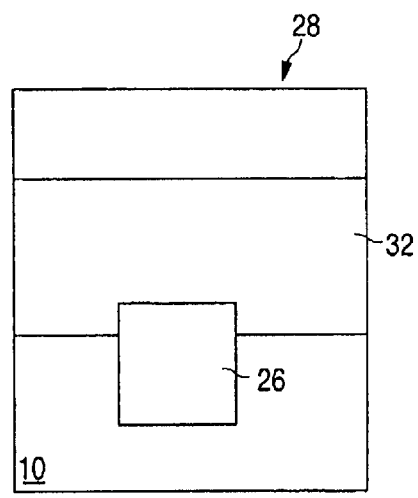
FIG. 6B  FIG. 7B
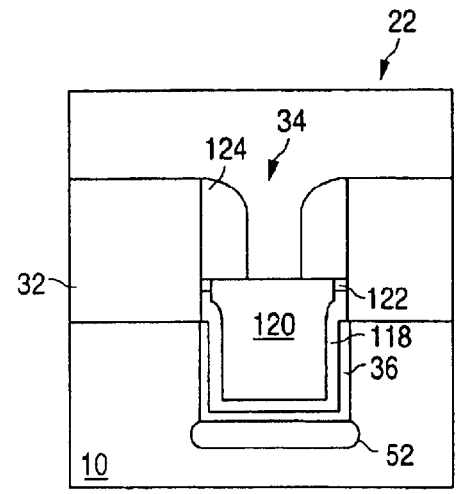
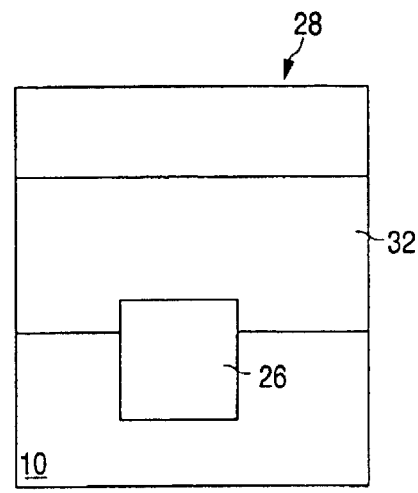
FIG. 6C  FIG. 7C

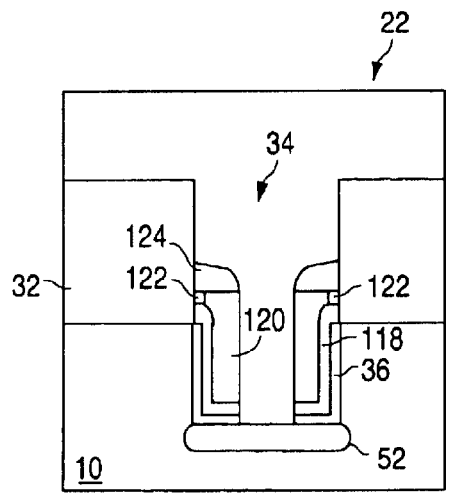
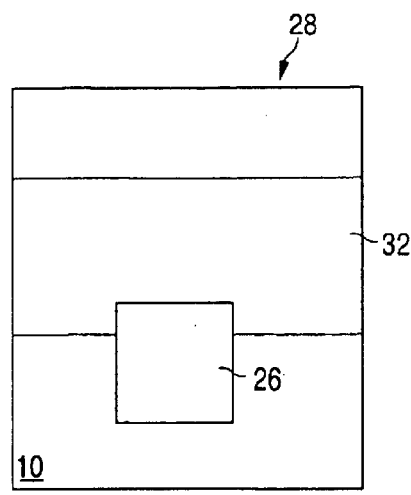
FIG. 6D   FIG. 7D
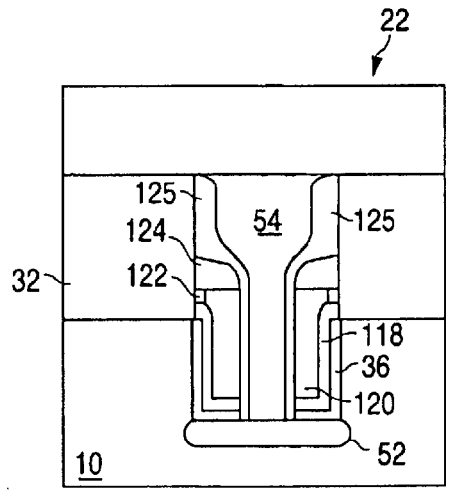
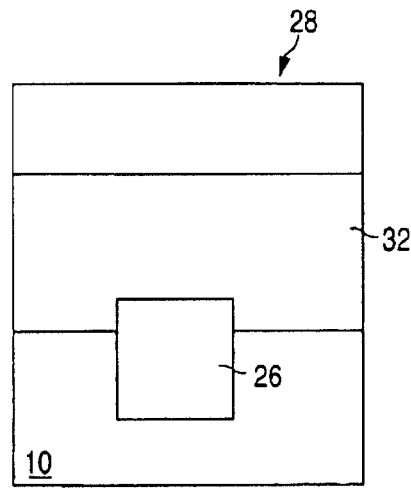
FIG. 6E   FIG. 7E
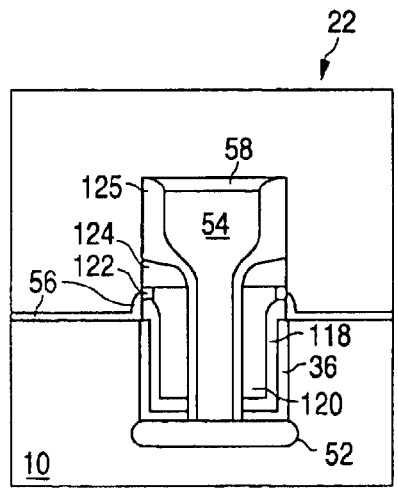
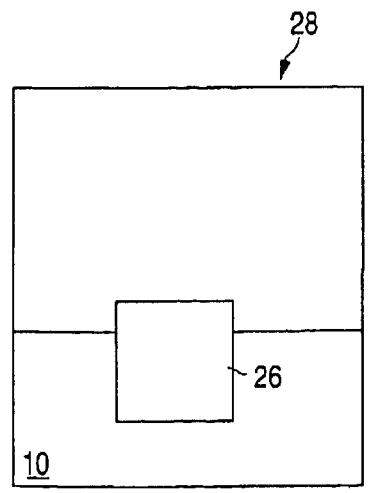
FIG. 6F   FIG. 7F

FIG. 6G  FIG. 7G

METHOD OF PROGRAMMING ELECTRONS ONTO A FLOATING GATE OF A NON-VOLATILE MEMORY CELL

This application is a continuation-in-part application of a co-pending application Ser. No. 10/358,623 filed on Feb. 4, 2003, which in turn claims the benefit of U.S. Provisional Application No. 60/370,888, filed Apr. 5, 2002, and entitled High Coupling Non-Volatile Trench Memory Cell; U.S. Provisional Application No. 60/393,696, filed Jul. 2, 2002, and entitled Non-Volatile Memory Trench Cell and Method of Making Same; and U.S. Provisional Application No. 60/398,146, filed Jul. 23, 2002, and entitled Non-Volatile Memory Trench Cell With Buried Floating Gate, all of which are incorporated herein in their entirety by reference.

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

Traditionally, floating gates are formed with a sharp edge facing a control gate to enhance Fowler-Nordheim tunneling, which is used to move electrons off of the floating gate during an erase operation. The sharp edge is typically formed by oxidizing or partially etching the top surface of the floating gate poly in an uneven manner. However, as the dimensions of the floating gate get smaller, this sharp edge can be more difficult to form in this manner.

There is also a need to improve the programming efficiency of memory cell array. Referring to FIG. 10A, there is shown a partial cross sectional view of a flash memory cell 200 of the prior art (as disclosed in U.S. Pat. No. 5,029,130, whose disclosure is incorporated herein by reference in its entirety). During programming, region 210 is held at or near ground voltage. Region 220 is supplied with a high voltage such as +10 volts. A depletion region 250 is then formed about the region 220. Further, because of the high capacitive coupling between region 220 and the floating gate 230, the floating gate 230 "sees" a voltage of approximately +7 volts. A voltage slightly more positive than the threshold voltage, such as +1.5 volts, is applied to the control gate 240. Since the voltage at the control gate 240 is less than the voltage at the floating gate 230, the field lines will emanate from the floating gate 230 to the substrate 260, and then to the control gate 240. When a positive voltage is applied to the control gate 240, the portion of the channel region beneath the control gate 240 is "turned on", i.e. an inversion layer 280 is formed. Electrons flow from the first region 210 near the surface of the substrate 260 in the inversion layer 280 until it reaches the pinch off point 295. At that point 295, the electrons are accelerated by the field lines. However, in order to "inject" electrons onto the floating gate 230, the electrons from the first region 210 must collide with (i.e. scatter) either impurities or lattice imperfections in the substrate 260 to generate momentum in the vertical direction. Further, only those electrons having sufficient vertical velocity to overcome the energy barrier between the oxide and the silicon will be injected onto the floating gate 230. As a result only a small percentage of electrons (on the order of 1 in a 1000) from the electron current in the inversion layer 280 will have sufficient energy to be injected onto the floating gate 230. Therefore, in this mechanism of programming, scattering is an essential component of the programming mechanism.

Referring to FIG. 10B there is shown another programming mechanism of the prior art involving an EPROM cell 300. Similar to the discussion for the flash cell 200 shown in FIG. 10a, during programming, first region 210 is held at or near ground voltage. Region 220 is supplied with a high voltage such as +12 volts. A depletion region 250 is then formed about the second region 220. A high voltage, such as +12 volts is also applied to the control gate 240, which results in the floating gate 230 "seeing' about +7 volts. Since the voltage on the floating gate 230 is less than the voltage at the depletion region 250, the field lines will emanate from the depletion region 250 to the floating gate 230. Further, with the floating gate "seeing" about +7 volts, the portion of the channel region beneath the floating gate 230 is "turned on", i.e. an inversion layer 280 is formed. Electrons flow from the first region 210 near the surface of the substrate 260 in the inversion layer 280 until it reaches the pinch off point 295. At that point 295, the electrons are accelerated by the field lines. However, the electrons are actually repulsed from the surface of the substrate 260 by the field lines. As a result the electrons travel in a "downward" direction. In order to "inject" electrons onto the floating gate 230, the electrons from the first region 210 must collide with either impurities or with the lattice imperfections in the substrate 260 to generate vertical component of momentum. Only those electrons having sufficient initial vertical velocity and then sufficiently in the upward vertical direction to overcome the 1) repulsive field in the substrate; 2) energy barrier at the silicon-oxide interface; and 3) repulsive field in the oxide will be injected onto the floating gate 230. As a result because initially the electrons are actually traveling "downward" a fewer percentage of electrons than even the percentage of electrons in the flash cell 200 are programmed (on the order of 1 in hundreds of thousands or even a million from the electron current in the inversion layer 280 will have sufficient energy to be injected onto the floating gate 230. Thus, similarly, in this mechanism of programming, scattering is an essential component of the programming mechanism.

Thus it is one object of the present invention to create a method to improve the programming efficiency of a non-volatile memory cell having a floating gate for storage of electrons.

It is known to form memory cell elements over non-planar portions of the substrate. For example, U.S. Pat. No. 5,780,341 (Ogura) discloses a number of memory device configurations that includes a step channel formed in the substrate surface. While the purpose of the step channel is to inject hot electrons more efficiently onto the floating gate, these memory device designs are still deficient in that it is difficult to optimize the size and formation of the memory cell elements as well the necessary operational parameters needed for efficient and reliable operation.

There is a need for a non-volatile, floating gate type memory cell array with significant cell size reduction while providing enhanced programming efficiency.

SUMMARY OF THE INVENTION

In the present invention, programming efficiency occurs by using a memory cell in a substrate of semiconductor material of a first conductivity type and having a first and second spaced-apart regions formed in the substrate of a second conductivity type. A non-co-planar channel region is formed in the substrate between the first and second regions. The non-co-planar channel region has two portions: a first portion and a second portion. An electrically conductive control gate has a portion disposed adjacent to and insulated from the first portion of the channel region for creating an inversion layer therein. A floating gate has a portion disposed adjacent to and insulated from the second portion of the channel region by an insulator, for creating a depletion region having field lines directed to the floating gate, when a positive voltage is coupled to the floating gate. The first region is adjacent to the inversion layer, a method of programming the device comprises creating the inversion layer. A stream of electrons is generated at the first region and the electrons traverse through the inversion layer. The electrons are is then accelerated through the depletion region by the field lines, with little or no scattering causing the electrons to be accelerated through the insulator and injected onto the floating gate.

BRIEF DESCRIPTION OF THE DRAWINGS

FIGS. 5A–5J are cross sectional views of the semiconductor structure in FIG. 1F taken along the line 2A—2A showing in sequence the steps in a first alternate processing embodiment of the semiconductor structure of the present invention.

FIGS. 7A–7D are cross sectional views of the isolation region of the semiconductor structure showing in sequence the steps in the second alternate processing embodiment of the structure shown in FIG. 3B.

DETAILED DESCRIPTION OF THE PREFERRED EMBODIMENTS

Figure 1A:
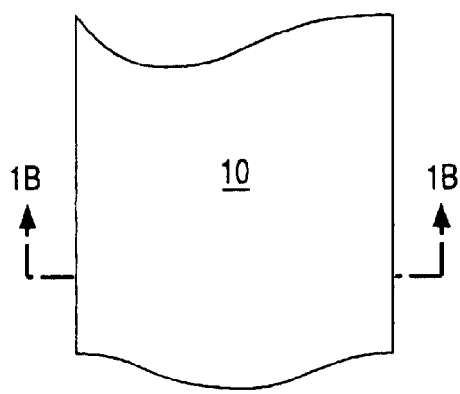
FIG. 1A is a top view of a semiconductor substrate used in the first step of the method of present invention to form isolation regions.
Figure 1B:
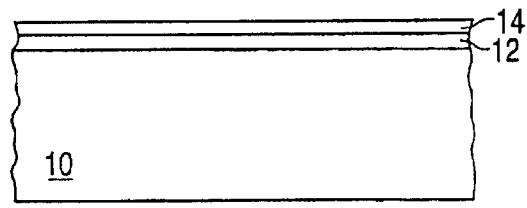
FIG. 1B is a cross sectional view of the structure taken along the line 1B—1B showing the initial processing steps of the present invention.
Figure 1D:
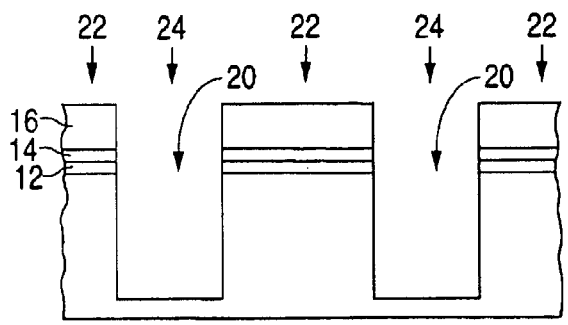
FIG. 1D is a cross sectional view of the structure in FIG. 1C taken along the line 1D—1D showing the isolation trenches formed in the structure.
Figure 1C:
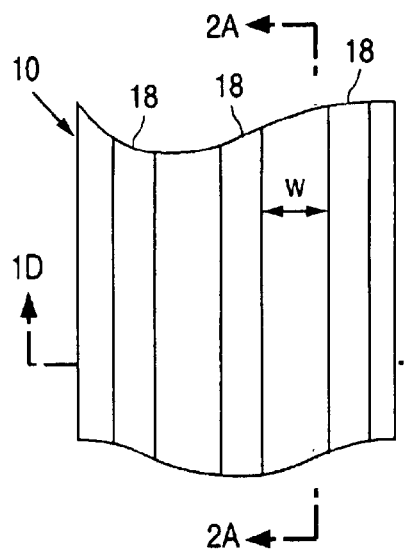
FIG. 1C is a top view of the structure showing the next step in the processing of the structure of FIG. 1B, in which isolation regions are defined.
Figure 1E:
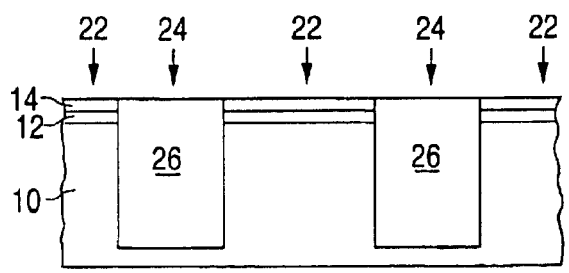
FIG. 1E is a cross sectional view of the structure in FIG. 1D showing the formation of isolation blocks of material in the isolation trenches.
Figure 1F:
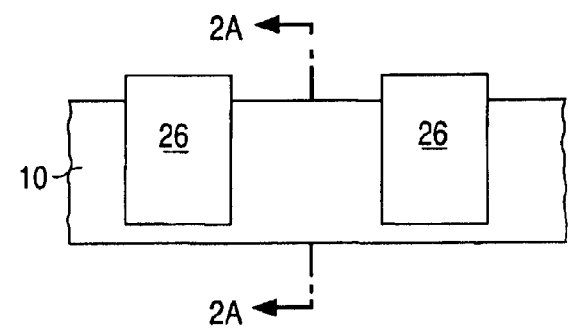
FIG. 1F is a cross sectional view of the structure in FIG. 1E showing the final structure of the isolation regions.
Figures 2A, 3A:
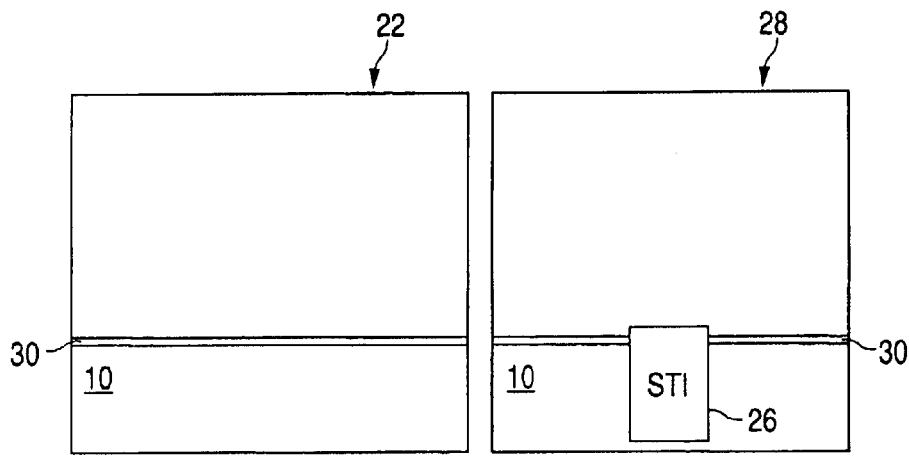
FIGS. 2A–2Q are cross sectional views of the semiconductor structure in FIG. 1F taken along the line 2A—2A showing in sequence the steps in the processing of the semiconductor structure in the formation of a non-volatile memory array of floating gate memory cells of the present invention.
FIGS. 3A–3Q are cross sectional views of a periphery region of the semiconductor structure showing in sequence the steps in the processing of the semiconductor structure in the formation of the non-volatile memory array of floating gate memory cells of the present invention.

The method of the present invention is illustrated in FIGS. 1A to 1F and 2A to 2Q (which show the processing steps in making the memory cell array of the present invention), and FIGS. 3A–3Q (which show the processing steps in making the periphery region(s) of the semiconductor structure). The method begins with a semiconductor substrate 10, which is preferably of P type and is well known in the art. The thicknesses of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

FIGS. 1A to 1F illustrate the well known STI method of forming isolation regions on a substrate. Referring to FIG.

1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50–150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000–5000 Å. FIG. 1B illustrates a cross-section of the resulting structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region 28 in which control circuitry is formed that will be used to operate the memory cells formed in the memory cell array region. Preferably, isolation blocks 26 are also formed in the periphery region 28 during the same STI or LOCOS process described above.

Memory Cell Formation

The structure shown in FIG. 1F is further processed as follows. FIGS. 2A to 2Q show the cross sections of the structure in the active regions 22 from a view orthogonal to that of FIG. 1F (along line 2A—2A as shown in FIGS. 1C and 1F), and FIGS. 3A to 3Q show the cross sections of the structure in the periphery region(s) 28, as the next steps in the process of the present invention are performed concurrently in both regions.

An insulation layer 30 (preferably oxide or nitrogen doped oxide) is first formed over the substrate 10, as shown in FIGS. 2A and 3A. The active region portions of the substrate 10 can be doped at this time for better independent control of the cell array portion of the memory device relative to the periphery region 28. Such doping is often referred to as a $V_t$ implant or cell well implant, and is well known in the art. During this implant, the periphery region is protected by a photo resist layer, which is deposited over the entire structure and removed from just the memory cell array region of the substrate.

Figures 2B, 3B:
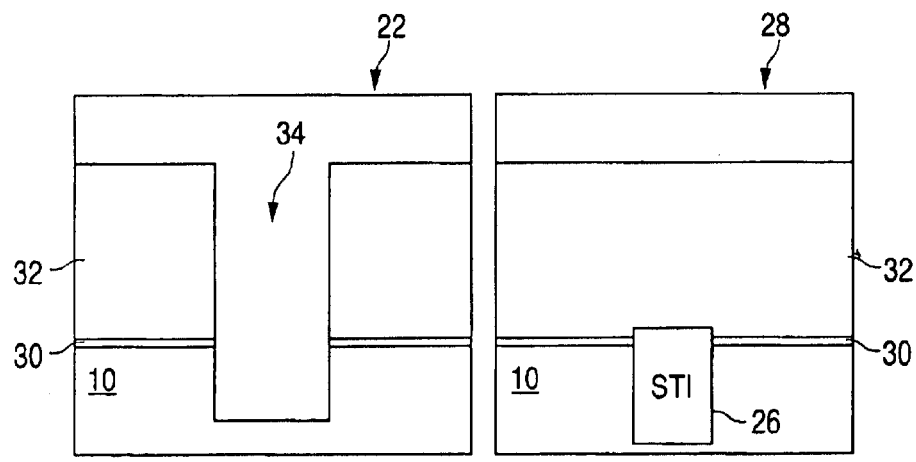

Next, a thick layer of hard mask material 32 such as nitride is formed over oxide layer 30 (e.g. ~3500 Å thick). A plurality of parallel second trenches 34 are formed in the nitride layer 32 by applying a photo resist (masking) material on the nitride layer 32, and then performing a masking step to remove the photo resist material from selected parallel stripe regions. An anisotropic nitride etch is used to remove the exposed portions of nitride layer 32 in the stripe regions, leaving second trenches 34 that extend down to and expose oxide layer 30. After the photo resist is removed, an anisotropic oxide etch is used to remove the exposed portions of oxide layer 30 and extend second trenches 34 down to the substrate 10. A silicon anisotropic etch process is then used to extend second trenches 34 down into the substrate 10 in each of the active regions 22 (for example, down to a depth of approximately one feature size deep, e.g. about 500 Å to several microns with 0.15 um technology). Alternately, the photo resist can be removed after trenches 34 are formed into the substrate 10. The resulting active/periphery regions 22/28 are shown in FIGS. 2B/3B.

Figures 2C, 3C:
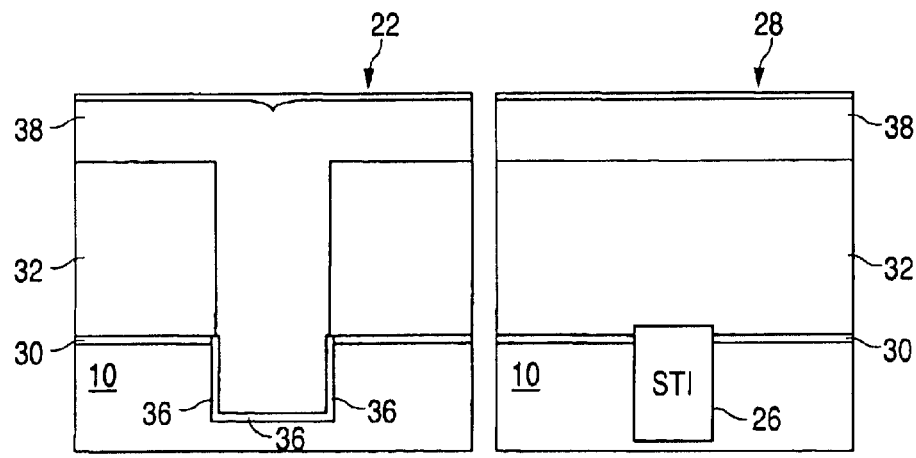

A layer of insulation material 36 is next formed (preferably using a thermal oxidation or CVD oxide process) along the exposed silicon in second trenches 34 that forms the bottom and lower sidewalls of the second trenches 34 (e.g. ~60 Å to 150 Å thick). A thick layer of polysilicon 38 (hereinafter "poly") is then formed over the structure, which fills second trenches 34. Poly layer 38 can be doped (e.g. n+) by ion implant, or by an in-situ doped poly process. The resulting active/periphery regions 22/28 are shown in FIGS. 2C/3C.

Figures 2D, 3D:
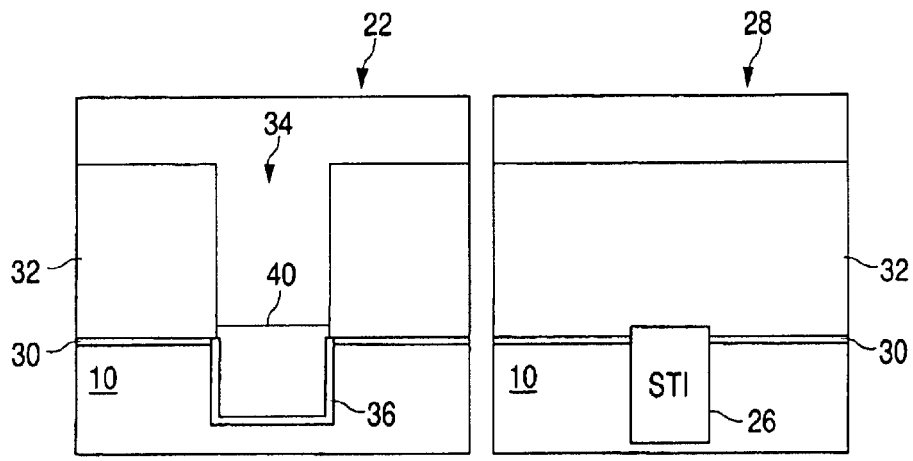

A poly etch process (e.g. a CMP process using nitride layer 32 as an etch stop) is used to remove poly layer 38 except for blocks 40 of the polysilicon 38 left remaining in second trenches 34. A controlled poly etch is then used to lower the height of poly blocks 40, where the tops of poly blocks 40 are disposed above the surface of the substrate, but below the tops of STI blocks 26 in the isolation regions 24, as shown in FIGS. 2D/3D.

Figures 2E, 3E:
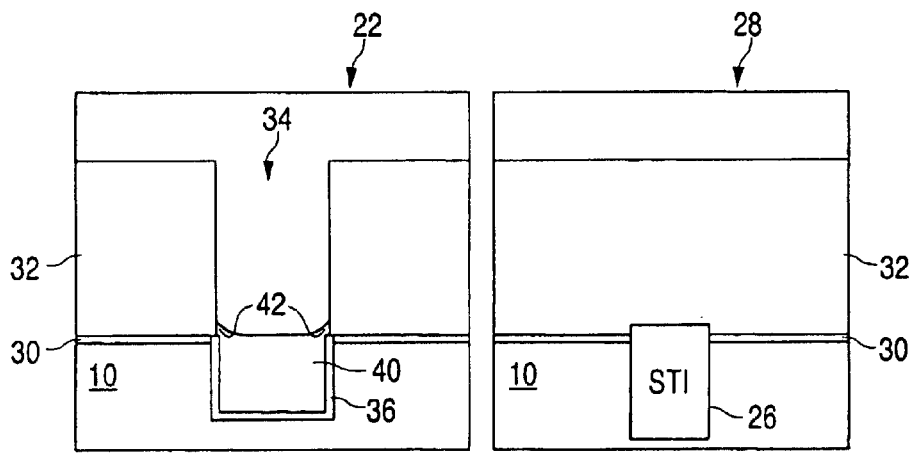
Figures 2F, 3F:
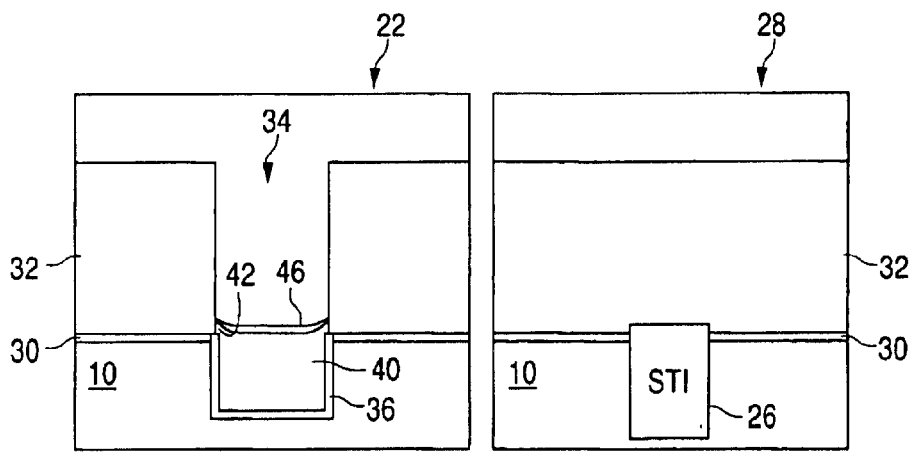
Figures 2G, 3G:
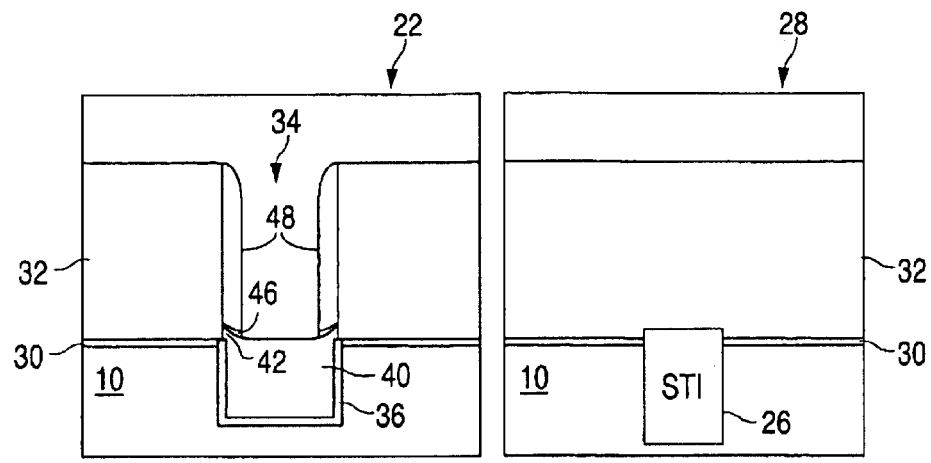

Another optional poly etch is then performed to create sloped portions 42 on the tops of poly blocks 40 (adjacent the second trench sidewalls), as shown in FIG. 2E. A thermal oxidation process is then performed to form or enhance the tips of sloped portions 42, which oxidizes the exposed top surfaces of the poly blocks 40 (forming oxide layer 46 thereon), as shown in FIG. 2F. Oxide spacers 48 are then formed along the sidewalls of the second trenches 34. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 48 are formed by depositing oxide over the structure (e.g. approximately 300 to 1000 Å thickness) followed by an anisotropic oxide etch. The oxide etch also removes the center portion of oxide layer 46 in each of the second trenches 34. The periphery region 28 is left unaffected. The resulting active/periphery regions 22/28 are shown in FIGS. 2G/3G.

Figures 2H, 3H:
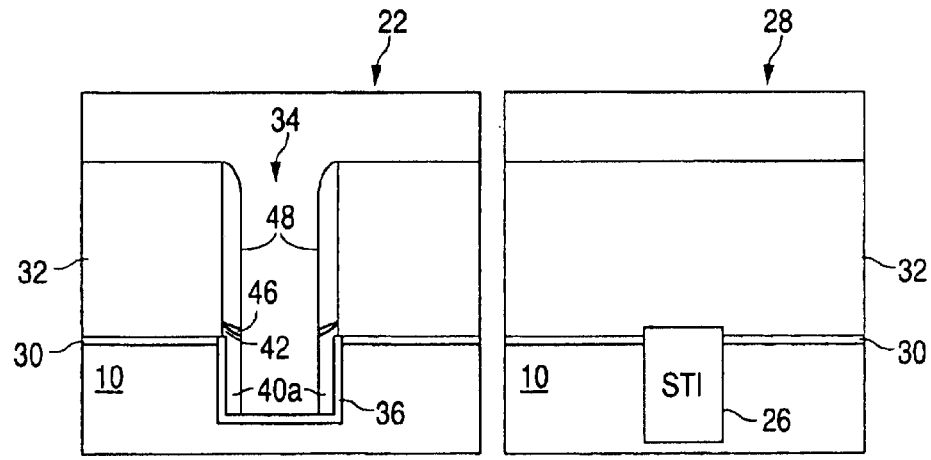
Figures 2I, 3I:
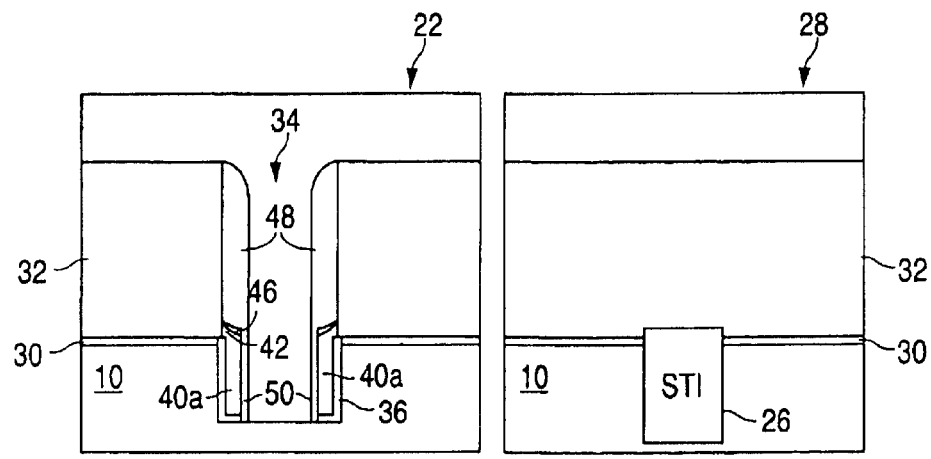

An anisotropic poly etch in combination with some oxide etch (for adjustment of STI oxide height, along the trench 34) is next performed, which removes the center portions of the poly blocks 40 that are not protected by oxide spacers 48, leaving a pair of opposing poly blocks 40a in each of the second trenches 34, as shown in FIG. 2H. An insulation deposition and anisotropic etch-back process is then used to form an insulation layer 50 along the exposed sides of poly blocks 40a inside second trenches 34. The insulation material could be any insulation material (e.g. ONO—oxide/nitride/oxide, or other high dielectric materials). Preferably, the insulation material is oxide, so that the oxide deposition/etch process also thickens the oxide spacers 48 and results in the removal of the exposed portions of oxide layer 36 at the bottom of each second trench 34 to expose the substrate, as shown in FIGS. 2I/3I.

Figures 2J, 3J:
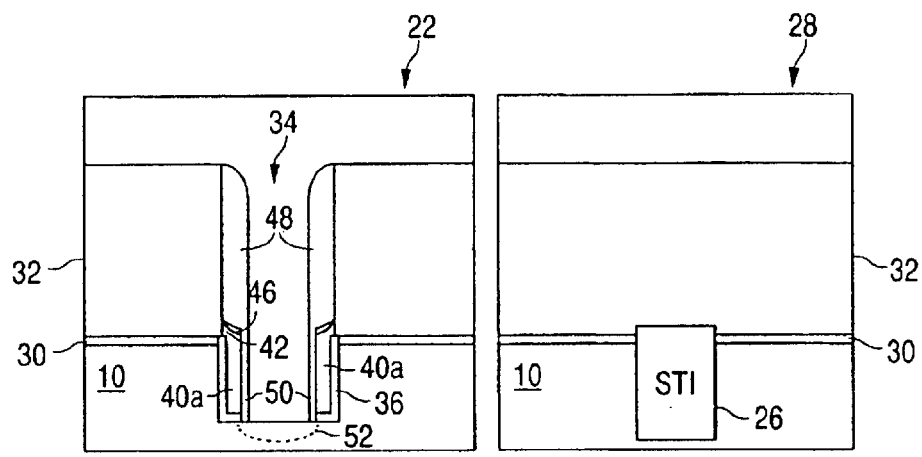

Suitable ion implantation that, depending upon if the substrate is P or N type, may include arsenic, phosphorous, boron and/or antimony (and possible anneal) is then made across the surface of the structure to form first (source) regions 52 in the exposed substrate portions at the bottom of second trenches 34. The source regions 52 are self-aligned to the second trenches 34, and have a second conductivity type (e.g. N type) that is different from a first conductivity type of the substrate (e.g. P type). The ions have no significant effect on the nitride layer 32. The resulting active/periphery regions 22/28 are shown in FIGS. 2J/3J.

Figures 2K, 3K:
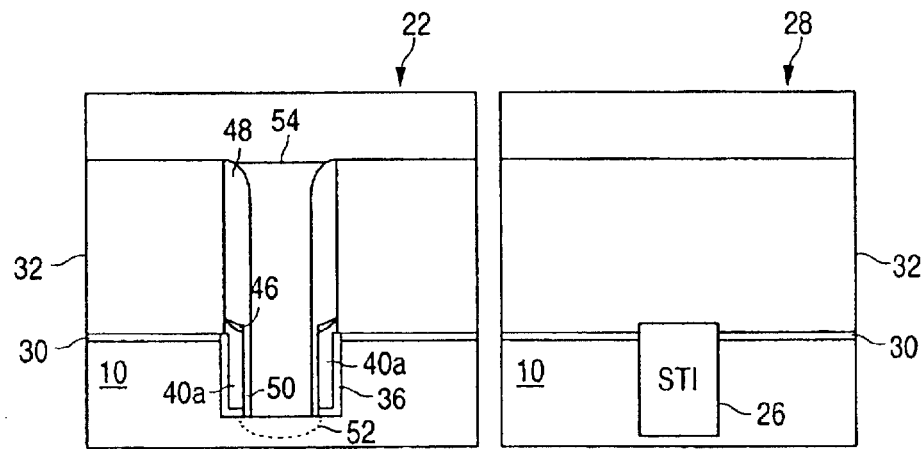
Figures 2L, 3L:
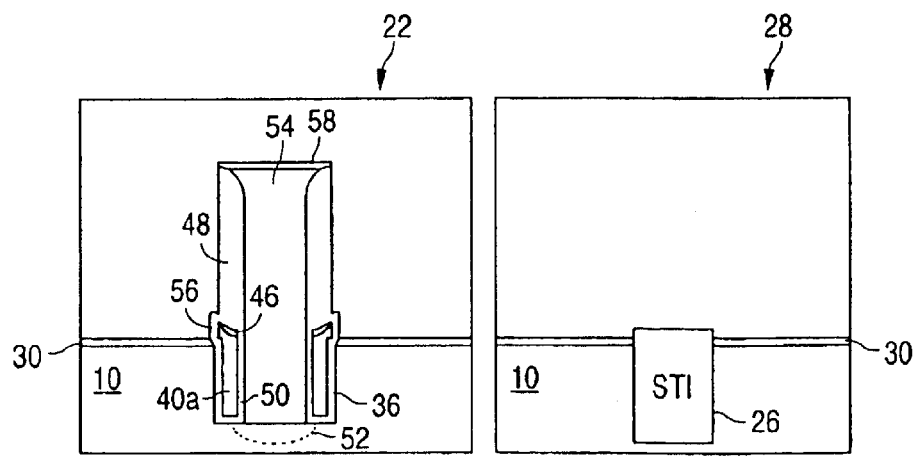

A poly deposition step, followed by a poly CMP etch (using the nitride layer 32 as an etch stop) are used to fill second trenches 34 with poly blocks 54, as shown in FIG. 2K. A nitride etch follows, which removes nitride layer 32, and exposes upper edges of the poly blocks 40a. A tunnel oxide layer 56 is next formed on the exposed upper edges of poly blocks 40a, either by thermal oxidation, oxide deposition, or both. This oxide formation step also forms an oxide layer 58 on the exposed top surfaces of poly blocks 54, as well as possibly thickening oxide layer 30 over substrate 10. Optional $V_t$ implantation in the periphery region 28 can be performed at this time by masking off the active regions 22. The resulting active/periphery regions 22/28 are shown in FIGS. 2L/3L.

Figures 2M, 3M:
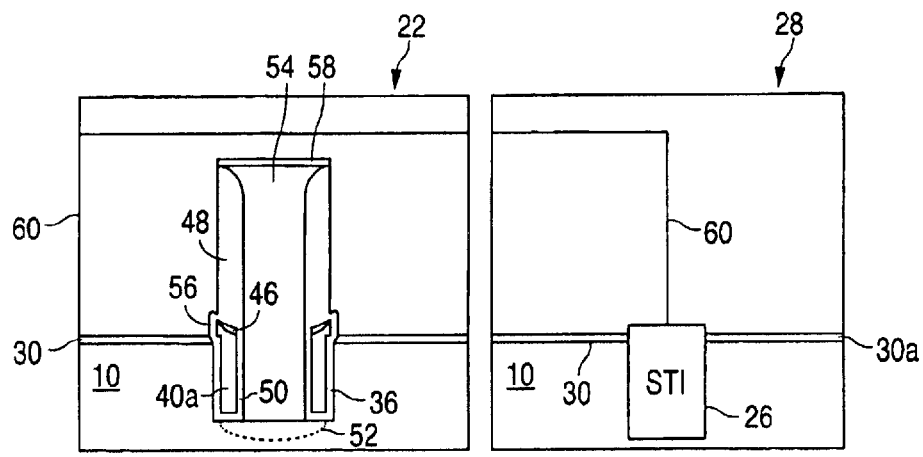

The oxide layer 30 serves as the gate oxide for both the memory cells in the active regions, and the control circuitry in the periphery region. For each device, the thickness of the gate oxide dictate's its maximum operating voltage. Thus, if it is desired that some of the control circuitry operate at a different voltage than the memory cells or other devices of the control circuitry, then the thickness of the gate oxide 32 can be modified at this point in the process. In way of example but not limitation, photo resist 60 is formed over the structure, followed by a masking step for selectively removing portions of the photo resist in the periphery region to expose portions of oxide layer 30. The exposed portions of oxide layer 30 can be thinned (e.g. by using a controlled etch) or replaced (e.g. by an oxide etch and oxide deposition) with oxide layer 30a having the desired thickness, as illustrated in FIGS. 2M/3M.

Figures 2N, 3N:
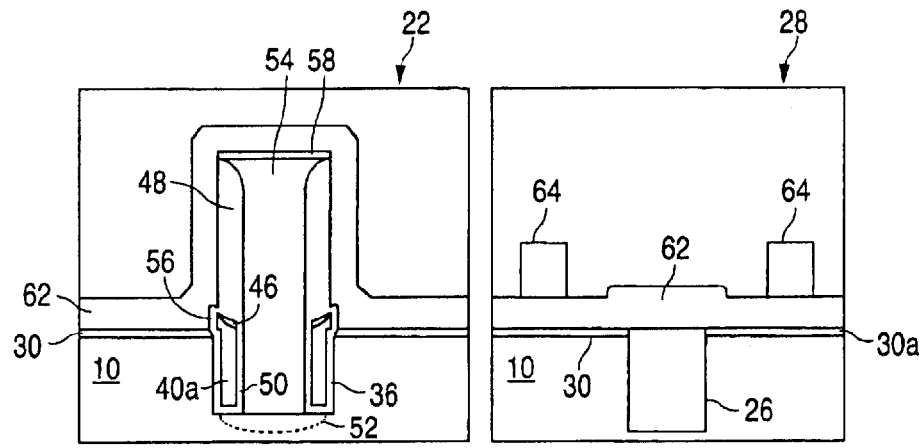
Figures 2O, 3O:
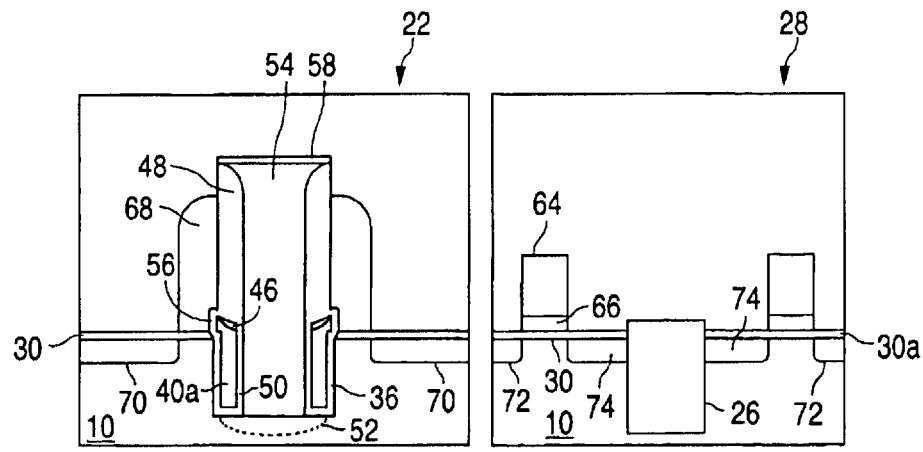

After removal of photo resist 60, a poly deposition step is used to form a poly layer 62 over the structure (e.g. approximately 500–3000 Å thick). Photo resist deposition and masking steps follow to form blocks of photo resist 64 on the poly layer in the periphery region 28, as shown in FIGS. 2N/3N. An anisotropic poly etch is then used to remove poly layer 62 except for poly blocks 66 under photo resist blocks 64 (in periphery region 28), and poly spacers 68 adjacent oxide spacers 48 (in active regions 22). Suitable ion implantation (and anneal) is used to form second (drain) regions 70 in the substrate active regions and source/drain regions 72/74 in the substrate periphery region 28 for the devices therein. The resulting active/periphery regions 22/28 are shown in FIGS. 2O/3O.

After the photo resist blocks 64 are then removed, insulation spacers 76 are formed by insulation material deposition and anisotropic etch (e.g. nitride or oxide), and are disposed against poly spacers 68, oxide spacers 48 and poly blocks 66. A metal deposition step is then performed, to deposit a metal such as tungsten, cobalt, titanium, nickel, platinum, or molybdenum over the active and periphery regions 22/28. The structures are then annealed, permitting the hot metal to flow and to seep into the exposed top portions of poly spacers 68 and poly blocks 66 to form a conductive layer of metalized polysilicon 78 (polycide) thereon. The metal deposited on the remaining structure is removed by a metal etch process. The resulting active/periphery regions 22/28 are shown in FIGS. 2P/3P.

Insulation material 80, such as BPSG or oxide, is then formed over the entire structure. A masking step is performed to define etching areas over the drain regions 70/74. The insulation material 80 is selectively etched in the masked regions to create contact openings that extend down to drain regions 70/74. The contact openings are then filled with a conductor metal (e.g. tungsten) to form metal contacts 82 that are electrically connected to drain regions 70/74. Drain line contacts 84/86 (e.g. aluminum, copper, etc.) are added to the active and periphery 22/28 regions respectively by metal masking over the insulation material 80, to connect together all the contacts 82 (and thus all the drain regions 70) in each active region 22, and to connect together a plurality of drain regions 74 in the periphery region 28. The final active region memory cell structure is illustrated in FIG. 2Q, and the final periphery region control circuitry structure is illustrated in FIG. 3Q.

As shown in FIG. 2Q, the process of the present invention forms pairs of memory cells that mirror each other, with a memory cell formed on each side of the poly block 54. For each memory cell, first and second regions 52/70 form the source and drain regions respectively (although those skilled in the art know that source and drain can be switched during operation). Poly block 40a constitutes the floating gate, and poly spacer 68 constitutes the control gate. Channel regions 90 for each memory cell are defined in the surface portion of the substrate that is in-between the source and drain 52/70. Each channel region 90 includes two portions joined together at an approximate right angle, with a first (vertical) portion 92 extending along the vertical wall of filled second trench 34 and a second (horizontal) portion 94 extending between the sidewall of filled second trench 34 and the drain region 70. Each pair of memory cells share a common source region 52 that is disposed underneath filled second trench 34 and is in electrical contact with poly block 54. Similarly, each drain region 70 is shared between adjacent memory cells from different mirror sets of memory cells.

Figure 4:
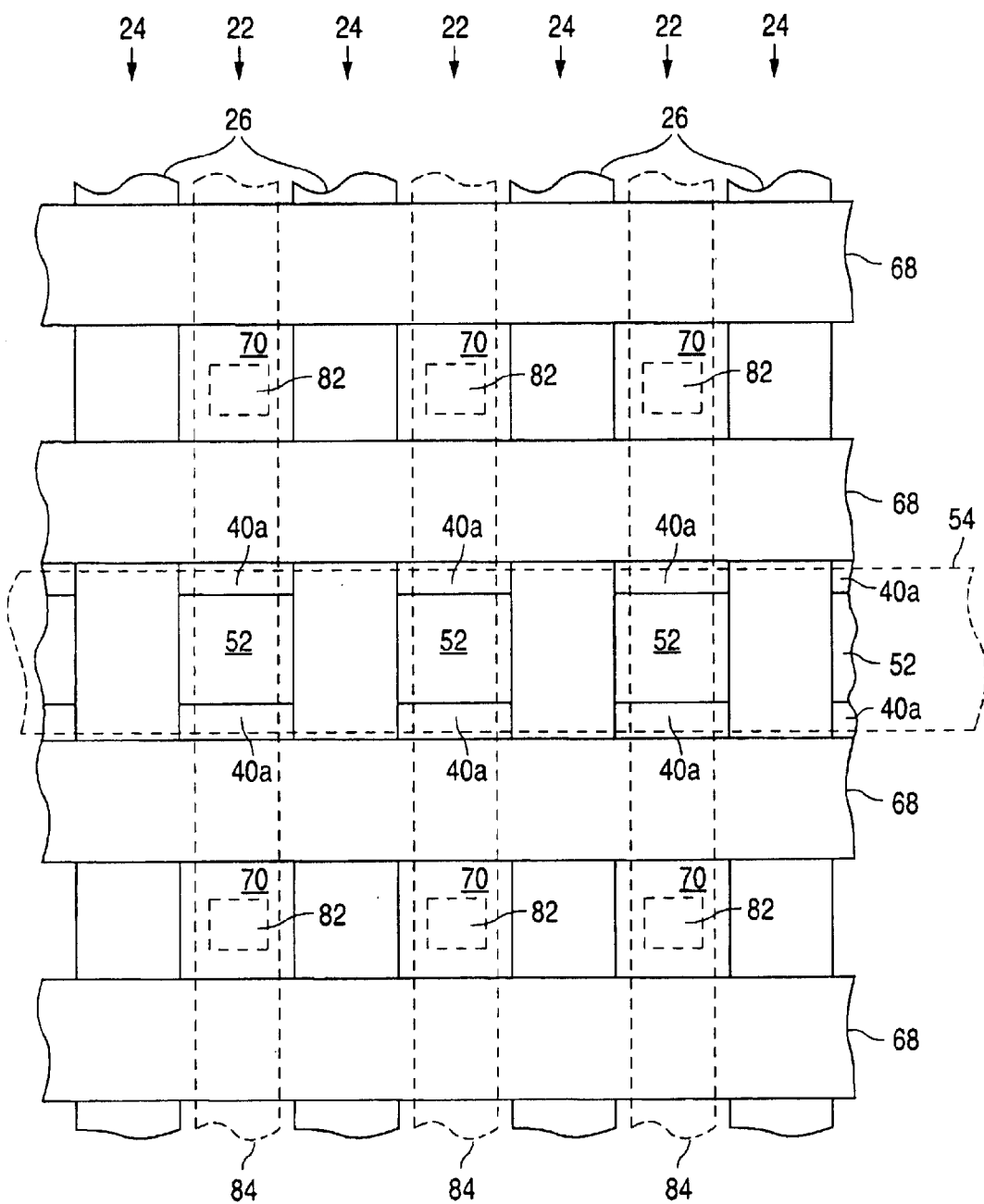
FIG. 4 is a top plan view of the memory cell array of the present invention.

FIG. 4 is a top view of the resulting structure showing the interconnection between bit lines 84 and drain regions 70, as well as control gates 68 which are continuously formed as control (word) lines that extend across both the active and isolation regions 22/24. The above-described process does not produce source regions 52 that extend across the isolation regions 24 (which can easily be done by a deep implant, or by removing the STI insulation material from the isolation region portions of second trenches 34 before ion implantation). However, poly blocks 54 (which are in electrical contact with source regions 52) are formed continuously across the isolation regions to adjacent active regions, and form source lines each of which electrically connects together all the source regions 52 for each row of paired memory cells.

The floating gates 40a are disposed in second trenches 34, with each floating gate facing and insulated from one of the channel region vertical portions 92, one of the source regions 52 and one of the poly blocks 54. Each floating gate 40a includes an upper portion that extends above the substrate surface and terminates in an edge 96 that faces and is insulated from one of the control gates 68, thus providing a path for Fowler-Nordheim tunneling through oxide layer 56. Poly blocks 54 each extend along and are insulated (by oxide layer 50) from floating gates 44a, for enhanced voltage coupling therebetween. It is important that there is at most only a partial vertical overlap between any control gate and any floating gate, so that excessive capacitive coupling therebetween does not hinder the operation of the memory cell described below. This means that if there is any vertical overlap between the control gate and the floating gate, that the control gate does not extend over (in the horizontal direction) enough to completely overlap (in the vertical direction) the floating gate.

Memory Cell Operation

The operation of the memory cells will now be described. The operation and theory of operation of such memory cells are also described in U.S. Pat. No. 5,572,054, whose disclosure is incorporated herein by reference with regard to the operation and theory of operation of a non-volatile memory cell having a floating gate and a control gate, floating gate to control gate tunneling, and an array of memory cells formed thereby.

To initially erase a selected memory cell in any given active region 22, a ground potential is applied to both its source 52 and drain 70. A high-positive voltage (e.g. +7 to +15 volts) is applied to the control gate 68. Electrons on the floating gate 40a are induced through the Fowler-Nordheim tunneling mechanism to tunnel from the upper end of the floating gate 40a (primarily from edge 96), through the oxide layer 56, and onto the control gate 68, leaving the floating gate 40a positively charged. Tunneling is enhanced by the sharpness of edge 96. It should be noted that since each of the control gates 68 extends across the active and isolation regions as continuous control (word) lines, one memory cell in each active region is 'erased' at the same time.

Figure 10A:
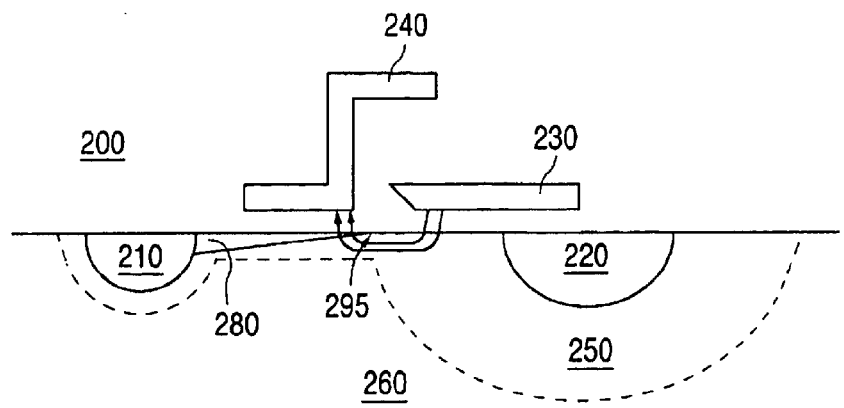
FIGS. 10A–10B are partial cross-section views of non-volatile memory cells of the prior art, flash and EPROM, respectively, and their programming mechanism.
Figure 10B:
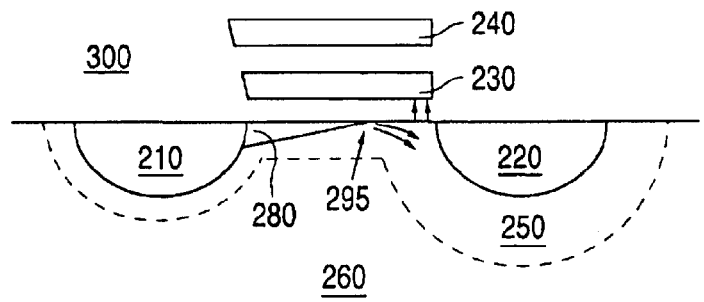
Figure 10C:
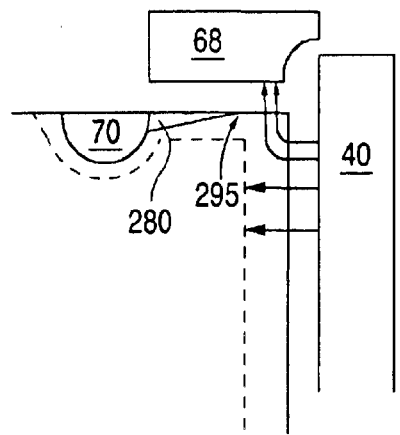
FIG. 10C is a partial cross-sectional view of a portion of the non-volatile memory cell of the present invention, and its programming mechanism.

When a selected memory cell is desired to be programmed, a small voltage (e.g. 0.5 to 2.0 V) is applied to its drain region 70. A positive voltage level in the vicinity of the threshold voltage of the MOS structure (on the order of approximately +0.2 to 1 volt above the drain node 70) is applied to its control gate 68. A positive high voltage (e.g. on the order of 5 to 10 volts) is applied to its source region 52. Because the floating gate 40 is highly capacitively coupled to the poly block 54, which is at the same voltage potential as the source region 52, the floating gate 40 "sees" a voltage potential of on the order of +4 to +8 volts. This forms a deep depletion region 250 in the substrate 10. Further, Since the voltage on the floating gate 40 is higher than the voltage on the control gate 68, the field lines will emanate from the floating gate 40 to the control gate 68, as shown in FIG. 10C. Further, since a positive voltage is applied to the control gate 68, an inversion layer 280 is formed in the substrate 10. The inversion layer 280 is connected to the drain region 70. A stream of programming electrons (as is well know current flows in a direction opposite to the stream of electrons) is then created at the drain region 70. The electrons traverse through the inversion layer 280 reaching a pinch off point 295. At the pinch off point 295, which is at or inside the depletion region 250, the electrons are accelerated by the field lines from the floating gate 40. As can be seen from FIG. 10C because the field lines emanate from the floating gate 40 directed to the control gate 68, the electrons are simply accelerated in the same general direction as the field lines. As they accelerate and gain energy, those electrons with sufficient energy will cross the insulating layer 36, and be injected onto the floating gate 40. Therefore, unlike the programming mechanism of the prior art, the electrons in the depletion region 250 do not require scattering to create a momentum component in the general direction of the floating gate 40. In fact, scattering is undesirable since it causes the electrons from the pinch off point 295 to actually lose momentum and energy in the direction toward the floating gate 40. Thus, in the programming mechanism of the present invention, electrons in the depletion region are accelerated and injected onto the floating gate 40 with little or no scattering.

As for the non-selected memory cells, low or ground potential is applied to the source/drain regions 52/70 and control gates 68 for memory cell rows/columns not containing the selected memory cell. Thus, only the memory cell in the selected row and column is programmed.

The injection of electrons onto the floating gate 40a will continue until the reduction of the charge on the floating gate 40a can no longer sustain a high surface potential along the vertical channel region portion 92 to generate hot electrons. At that point, the electrons or the negative charges in the floating gate 40a will decrease the electron flow from the drain region 70 onto the floating gate 40a.

Finally, to read a selected memory cell, ground potential is applied to its source region 52. A read voltage (e.g. ~0.5 to 2 volts) is applied to its drain region 70 and approximately 1 to 4 volts (depending upon the power supply voltage of the device) is applied to its control gate 68. If the floating gate 40a is positively charged (i.e. the floating gate is discharged of electrons), then the vertical channel region portion 92 (directly adjacent to the floating gate 40a) is turned on. When the control gate 68 is raised to the read potential, the horizontal channel region portion 94 (directly adjacent the control gate 68) is also turned on. Thus, the entire channel region 90 will be turned on, causing electrons to flow from the source region 52 to the drain region 70. This sensed electrical current would be the "1" state.

On the other hand, if the floating gate 40a is negatively charged, the vertical channel region portion 92 is either weakly turned on or is entirely shut off. Even when the control gate 68 and the drain region 70 are raised to the read potential, little or no current will flow through vertical channel region portion 92. In this case, either the current is very small compared to that of the "1" state or there is no current at all. In this manner, the memory cell is sensed to be programmed at the "0" state. Ground potential is applied to the source/drain regions 52/70 and control gates 68 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program efficiency. Memory cell size is reduced significantly because the source regions 52 are buried inside the substrate 10, and are self-aligned to the second trenches 34, where space is not wasted due to limitations in the lithography generation, contact alignment and contact integrity. Each floating gate 40a has a lower portion disposed in second trench 34 formed in the substrate for receiving the tunneling electrons during the program operation and for turning on the vertical channel region portion 92 during the read operation. Each floating gate 40a also has an upper portion that extends out of the second trench formed in the substrate and terminates in an edge facing the control gate for Fowler Nordheim tunneling thereto during the erase operation.

Program efficiency is greatly enhanced in the present method by the electrons being accelerated by the field lines emanating form the floating gate, and with little or no impact ionization to cause the electrons to lose momentum or energy. The estimated program efficiency (number of electrons injected compared to total number of electrons) in a prior art device shown in FIG. 10A is estimated at about 1/1000. However, in the present invention, the program efficiency is improved by 10 fold or even 100 fold, where almost all the electrons are injected onto the floating gate.

Also with the present invention, there is also an enhanced voltage coupling between each floating gate 40a and the corresponding source region 52 via the poly block 54 (electrically connected with the source region 52). At the same time, there is relatively low voltage coupling between the floating gate 40a and the control gate 68. Furthermore, having source region 52 and drain region 70 separated vertically as well as horizontally allows easier optimization of reliability parameters without affecting cell size.

First Alternate Embodiment

FIGS. 5A to 5J show the cross sections of the structure in the active regions 22 for an alternate method for making the memory cell array of the present invention. This first alternate process starts with the structure shown in FIG. 2A. For simplicity, elements in common with the first embodiment described above are designated using the same element numbers.

The thick nitride layer 32 (e.g. ~1000 to 10,000 Å in thickness) is formed over oxide layer 30. Parallel second trenches 34 are formed in the nitride layer 32 by applying a photo resist (masking) material on the nitride layer 32, and then performing a masking step to remove the photo resist material from selected parallel stripe regions. An anisotropic nitride etch is used to remove the exposed portions of nitride layer 32 in the stripe regions, leaving second trenches 34 that extend down to and expose oxide layer 30. After the photo resist is removed, oxide spacers 102 are formed in second trenches 34 by an oxide deposition step, followed by an oxide anisotropic etch step. The portions of oxide layer 30 in the bottom center of the second trenches are also removed during this oxide etch step, exposing the underlying substrate 10. The resulting structure is shown in FIG. 5A.

A silicon anisotropic etch process is used to extend second trenches 34 down into the substrate 10 in each of the active regions 22 (for example, down to a depth of approximately 500 Å to several microns with 0.15 um technology). The width of the second trenches 34 in substrate 10 is essentially the spacing between the oxide spacers 102. Suitable ion implantation (and possible anneal) is then made across the surface of the structure to form the first (source) regions 52 in the exposed substrate portions at the bottom of second trenches 34. The source regions 52 are self-aligned to the second trenches 34, and have a second conductivity type (e.g. N type) that is different from a first conductivity type of the substrate (e.g. P type). The ions have no significant effect on the nitride layer 32. The resulting structure is shown in FIG. 5B.

Oxide layer 100 is next formed on the exposed silicon substrate 10 (forming the bottom and lower sidewalls of the second trenches 34), preferably by thermal oxidation (e.g. ~70 to 150 Å thick). A thick poly layer is then formed over the structure, which fills second trenches 34. A poly CMP etch process, using nitride layer 32 as an etch stop, is used to remove poly layer except for poly blocks 54 left remaining in second trenches 34. A controlled poly etch is then used to lower the height of poly blocks 54 below the top of nitride layer 32. An optional oxide layer 104 is then formed on the poly blocks 54 (e.g. by thermal oxidation). A thin nitride layer 106 is then deposited over the structure, followed by masking step and nitride etch to remove the nitride layer 106 except for those portions over oxide layer 104 and poly blocks 54. This can be accomplished by depositing photo resist over the structure, followed by a controlled exposure so that only the photo resist in the second trench 34 is left covering the deposited nitride. The resulting structure is shown in FIG. 5C.

Using the nitride layer 106 as a mask, a dry and/or wet oxide etch is used to remove the oxide spacers 102. A thermal oxidation process follows, which forms oxide layer 108 on exposed side portions of poly blocks 54 and on exposed portions of the substrate. An anisotropic oxide etch is used to removed the oxide layer 108 just formed on the substrate. The resulting structure is shown in FIG. 5D.

Using nitride layers 32 and 106 as masks, a silicon etch is used to etch away the exposed silicon substrate in second trenches 34 down to a depth even with the bottoms of poly blocks 54. Additional ion implantation (and possible anneal) is used to expand source regions 52 underneath second trenches 34, as shown in FIG. 5E.

An insulation layer 110 is then formed on the second trench sidewalls, preferably by CVD deposition of oxide (e.g. ~70–150 Å thick). A thick poly layer is formed over the structure which fills second trenches 34, followed by a CMP poly etch (using nitride layer 32 as an etch stop) and additional poly etch to form poly blocks 40a having tops that are below that of the STI oxide blocks 26 in the isolation regions 24. Sloped etching or oxidation is then used to sharpen edges 96 on the tops of poly blocks 40a. An oxide deposition and etch back process is then used to fill the top portions of second trenches 34 with oxide 112, which seals poly blocks 40a and creates oxide spacers at the tops of second trenches 34. The resulting structure is shown in FIG. 5F, and includes three poly blocks in each second trench, surrounded and sealed by oxide. Poly block 54 is in electrical contact with source region 52 and disposed between the pair of poly blocks 40a (which are insulated from source region 52).

An optional extension of poly block 54 can be performed by removing nitride layer 106 and oxide layer 104 via controlled nitride and oxide etches, followed by a poly deposition and poly CMP etch back. An optional poly etch can be used to lower the new tops of poly blocks 54 before an oxidation process is used to form a protective oxide layer 114 over poly blocks 54, as shown in FIG. 5G. A nitride etch is next used to remove nitride layer 32. A controlled oxide etch is then used to recess the exposed oxide by about 10 to several hundred angstroms, followed by a thermal oxidation process that reforms oxide layers 30 and 114 and results in an indentation in the oxide surrounding the tops of poly blocks 40a). The resulting structure is shown in FIG. 5H.

A poly deposition and anisotropic poly etch is used to form poly spacers 68 adjacent oxide spacers 112. Suitable ion implantation (and anneal) is used to form second (drain) regions 70 in the substrate. Insulation spacers 76 are then formed by insulation material deposition and anisotropic etch (e.g. nitride or oxide), and are disposed against poly spacers 68. A metal deposition step is then performed, to deposit a metal such as tungsten, cobalt, titanium, nickel, platinum, or molybdenum over the structure, which is then annealed to permit the hot metal to flow and to seep into the exposed top portions of poly spacers 68 to form polycide 78 thereon. The remaining metal deposited on the remaining structure is removed by a metal etch process. The resulting structure is shown in FIG. 5I.

Insulation material 80, metal contacts 82, and drain line contact 84 are formed as described above with respect to FIG. 2Q to result in the final structure shown in FIG. 5J. The advantage of this embodiment is the ease with which the solid source line poly blocks 54 are formed, and their electrical contact with source regions 52. Moreover, using the poly block 54 to separate the later formed floating gate poly blocks 40a makes it easier to prevent shorts between the floating gates.

Second Alternate Embodiment

FIGS. 6A to 6G and 7A to 7G illustrate a second alternate method for making the memory cell array of the present invention. This second alternate process begins with the structures shown in FIGS. 2B and 3B, but without the formation of oxide layer 30 underneath nitride layer 32, as oxide layer 30 is optional for this embodiment. After the formation of insulation material 36 as described above with respect to FIG. 2C, the ion implantation (and possible anneal) process is used to form the first (source) regions 52 in the exposed substrate portions at the bottom of second trenches 34. A thin poly layer 118 is then formed over the structures, as shown in FIGS. 6A and 7A. Poly layer 118 can be doped (e.g. n+) by ion implant, or by an in-situ process. The thickness of poly layer 118 is preferably 50–500 Å, and dictates the eventual thickness of the floating gates for the final memory cell device.

Oxide is formed over the structure, followed by a planarizing oxide etch (e.g. CMP etch using portions of poly layer 118 over nitride layer 32 as an etch stop) which fills second trenches 34 with oxide blocks 120. A poly etch follows that removes the exposed portions of poly layer 118 (i.e. those portions over nitride layer 32). An oxide etch is next used to recess the oxide blocks 120 down even with those portions of poly layer 118 left disposed over the STI blocks 26 in the isolation regions 24 (e.g. using portions of poly layer 118 in the inactive regions over STI blocks 26 as an oxide etch stop). The resulting active/peripheral region structures are shown in FIGS. 6B and 7B.

Figure 6H:
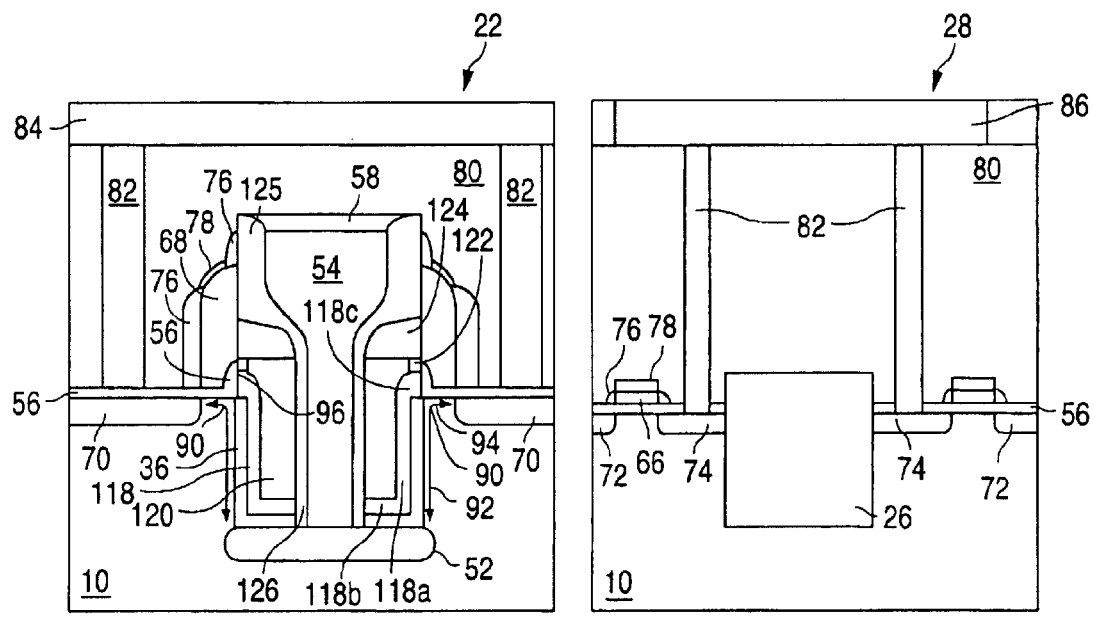
FIGS. 6A to 6D are cross sectional views of a semiconductor structure showing in sequence the steps in a second alternate processing embodiment of the semiconductor structure shown in FIG. 2B.
Figure 6H:
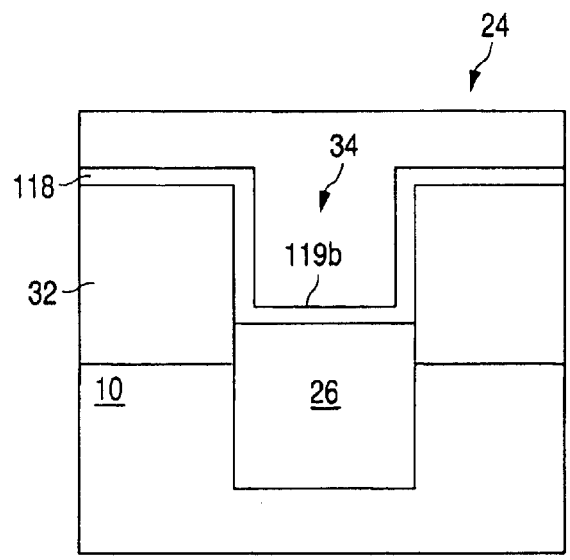

It should be noted that two different portions of poly layer 118, disposed at two different topography levels, are used as an etch stop in the oxide etch, poly etch, oxide etch process just described. Specifically, as shown in FIG. 6A, poly layer 118 has first portions 119a formed over the nitride layer 32 outside the trench 34. FIG. 6H is the same view of the second trench 34 as shown in FIG. 6A, but in the isolation regions 24 instead of the active regions 22. As shown in FIG. 6H, poly layer 118 has second portions 119b formed over STI blocks 26. Thus, poly layer portions 119a are disposed at a higher topography level than that of poly layer portions 119b. In order to form oxide block 120 in the active regions, the first oxide etch is performed using poly layer portions 119a as an etch stop to evenly fill second trenches 34 in both the active and isolation regions 22/24. The subsequent oxide etch uses poly layer portions 119b as an etch stop to set the proper level of oxide block 120 in the active region and to fully expose poly layer 118 in the isolation region 24.

A poly etch is next used to remove exposed portions of poly layer 118 (i.e. along upper portions of second trenches 34 in the active regions, and over STI blocks 26 in the isolation regions 24). An oxidation process follows, to form oxide blocks 122 on the exposed end portions of poly layer 118. Dielectric spacers 124, such as oxide, are then formed, inside second trenches 34 over oxide blocks 122 and partially over oxide blocks 120, via oxide deposition and etch back, as shown in FIG. 6C. Another oxide etch is then used to remove the exposed center portion of oxide blocks 120 (between spacers 124, which are reduced in height by the oxide etch), exposing poly layer 118 at the center of second trenches 34. A poly etch and an oxide etch follow to remove the exposed portions of poly layer 118 and oxide layer 36 at the bottom center of second trenches 34, exposing portions of the substrate. The resulting structures are shown in FIGS. 6D/7D.

Dielectric spacers 125 are next formed inside second trenches 34 by depositing nitride (or oxide) over the structure, followed by an anisotropic nitride etch. Second trenches 34 are then filled with poly blocks 54 using a poly deposition and CMP etch back process (using nitride layer 32 as an etch stop), as shown in FIG. 6E. Nitride layer 32 is removed from the active and isolation regions 22/24 and periphery region 28 using a nitride etch. The tunnel oxide layer 56 is next formed on the exposed upper edges of poly layer 118, either by thermal oxidation, oxide deposition, or both. Since oxide layer 32 was not formed earlier in this process, the oxide layer 56 also extends over the exposed portions of substrate 10. This oxide formation step also forms oxide layer 58 on the exposed top surfaces of poly blocks 54. Optional $V_t$ implantation in the periphery region 28 can be performed at this time by masking off the active regions 22. The resulting active/periphery regions 22/28 are shown in FIGS. 6F/7F.

The remaining processing steps described above with respect to FIGS. 2M through 2Q are next performed on the structures shown in FIGS. 6F and 7F, resulting in a final active region memory cell structure illustrated in FIG. 6G, and the final periphery region control circuitry structure illustrated in FIG. 7G.

As shown in FIG. 6G, L-shaped poly layer 118 constitutes the floating gate for each of the memory cells. Each floating gate 118 includes a pair of orthogonally oriented elongated portions 118a/118b joined together at their proximal ends. Floating gate portion 118a extends along and is insulated from the substrate sidewall of second trench 34, with an upper segment 118c extending above the substrate surface. Floating gate portion 118b extends along and is insulated from a bottom substrate wall of second trench 34 (i.e. disposed over and insulated from source region 52). The control gate spacer 68 has a first portion laterally adjacent to and insulated from the floating gate upper segment 118c, and a second portion disposed over and insulated from the upper segment 118c. The floating gate segment 118c has a distal end that terminates in a thin tip portion having an edge 96 that directly faces and is insulated from the control gate 68, thus providing a path for Fowler-Nordheim tunneling between the floating gate 118 and the control gate 68.

The second alternate embodiment of the present invention provides a memory cell array with reduced size and superior program efficiency. Memory cell size is reduced significantly because the source regions 52 are buried inside the substrate 10, and are self-aligned to the trenches 34, where space is not wasted due to limitations in the lithography generation, contact alignment and contact integrity. Program efficiency is greatly enhanced by "aiming" the horizontal portion 94 of the channel region 90 at the floating gate 118. The L-shaped floating gate configuration of the present invention provides many advantages. Because the floating gate portions 118a/118b are made from a thin layer of poly material, the upper tip thereof is narrow and enhances Fowler-Nordheim tunneling to the control gate 68. There is no need for extensive thermal oxidation steps to form sharp edges for enhanced tunneling. There is also an enhanced voltage coupling ratio between each floating gate 118 and the corresponding source region 52 given the proximity of the horizontal floating gate portion 118b and the source region 52 (separated only by thin oxide layer 36). Since the upper tip of floating gate upper segment 118c of floating gate portion 118a is not formed using an oxide process, but instead is formed by the deposition of a thin layer of polysilicon, more heavily doped polysilicon can be used to prevent poly depletion problems during operation. Moreover, having source region 52 and drain region 70 separated vertically as well as horizontally allows easier optimization of reliability parameters without affecting cell size.

It should be noted that for this embodiment, voltage coupling between floating gates 118 and source regions 52 are sufficient, so that additional voltage coupling with poly blocks 54, while favorable, is not necessary. Poly blocks 54 for this embodiment serve mainly to electrically connect all the source regions 52 in each row of paired memory cells together. Therefore, poly blocks 54 can be omitted from this embodiment, so long as an electrical contact similar to contact 82 is formed down to each source region 52. It should also be noted that each poly block 54 needs to be insulated from the substrate as it crosses the isolation regions, so that it does not short to the substrate. This is accomplished by making the depth of STI blocks 26 in the isolation regions deeper than the bottom of second trench 34, or by ensuring the material for STI blocks 26 etches slower than the material used to form oxide blocks 120.

Third Alternate Embodiment

Figures 8A, 9A:
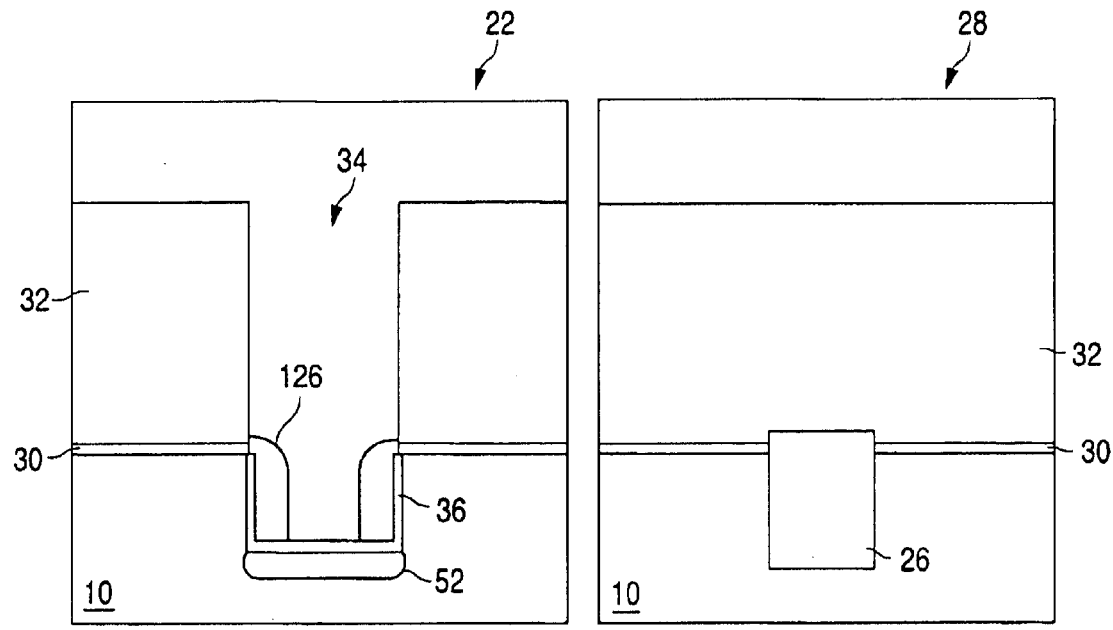
FIGS. 8A to 8D are cross sectional views of a semiconductor structure showing in sequence the steps in a third alternate processing embodiment of the semiconductor structure shown in FIG. 2B.
FIGS. 9A–9D are cross sectional views of the isolation region of the semiconductor structure showing in sequence the steps in the third alternate processing embodiment of the structure shown in FIG. 3B.

FIGS. 8A to 8D and 9A to 9D illustrate a third alternate method for making the memory cell array of the present invention. This third alternate process begins with the structures shown in FIGS. 2B and 3B. After the formation of insulation material 36 as described above with respect to FIG. 2C, the ion implantation (and possible anneal) process is used to form the first (source) regions 52 in the exposed substrate portions at the bottom of second trenches 34. Poly spacers 126 are then formed in second trenches 34 by forming a layer of polysilicon over the structure, followed by an anisotropic poly etch that removes the poly layer except for the poly spacers 126, as shown in FIGS. 8A and 9A. The poly spacers preferably have a height no greater than the STI blocks 26 in the isolation regions 24 (e.g. use STI blocks 26 in the inactive regions as an etch stop), which ensures all the polysilicon is removed from the isolation regions.

Figures 8B, 9B:
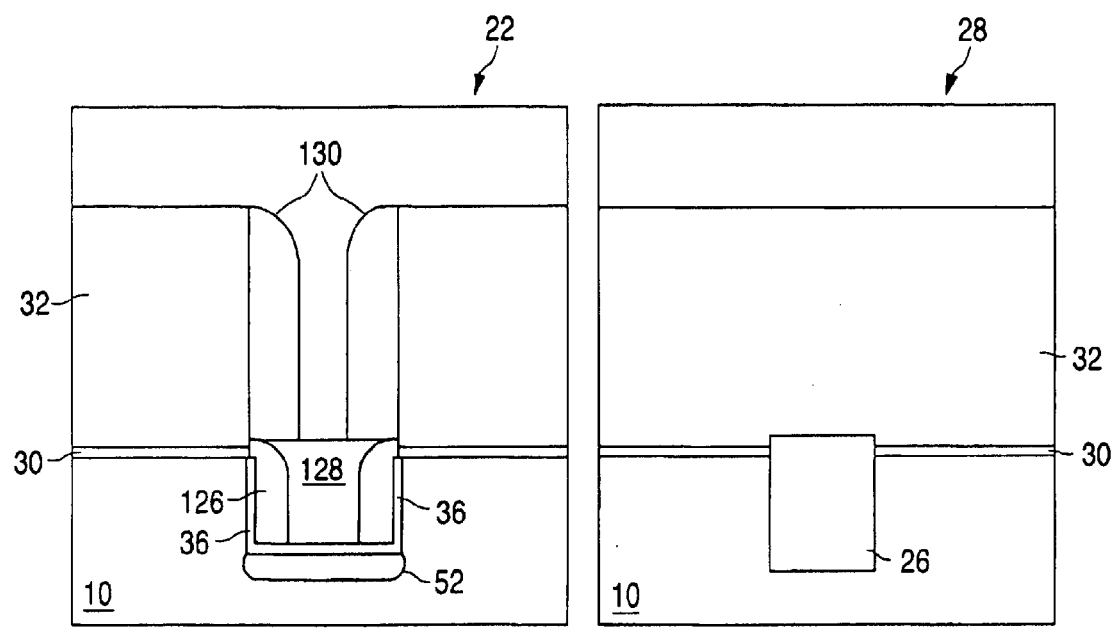

Oxide is formed over the structures of FIGS. 8A/9A, followed by a planarizing oxide etch (e.g. CMP etch using nitride layer 32 as an etch stop), which fills second trenches 34 with oxide blocks 128. An oxide etch is next used to recess the oxide blocks 128 down even with the tops of poly spacers 126 (e.g. use poly spacers 126 as an oxide etch stop). Dielectric spacers 130, such as oxide, are then formed inside second trenches 34 and over poly spacers 126, via oxide deposition and etch back, as shown in FIG. 8B. Another oxide etch is then used to remove the exposed center portions of oxide blocks 128 and oxide layer 36 (between spacers 130, which are reduced in height by the oxide etch), exposing portions of the substrate. The resulting structures are shown in FIGS. 8C/9C.

Figures 8C, 9C:
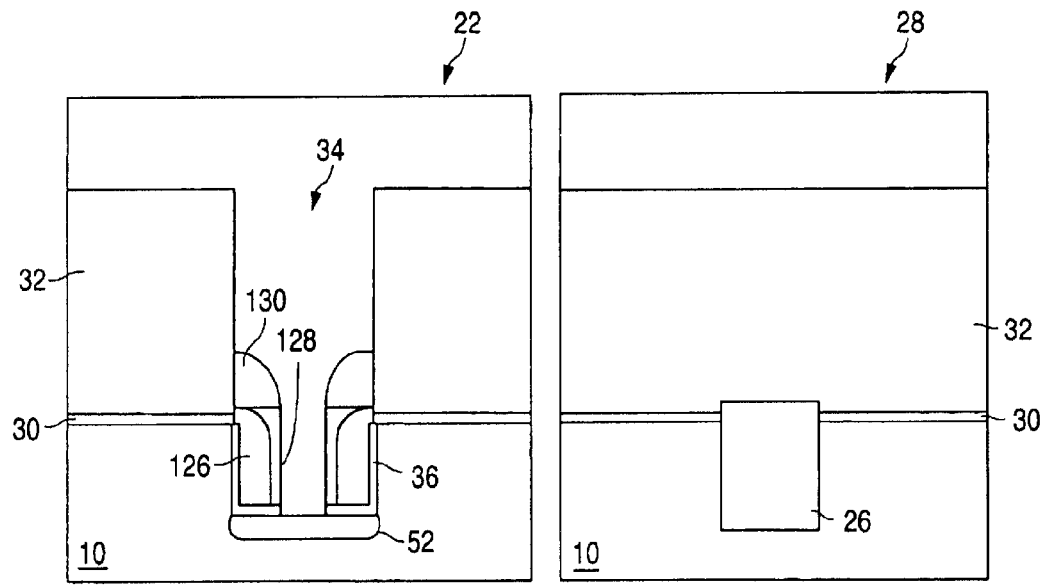
Figures 8D, 9D:
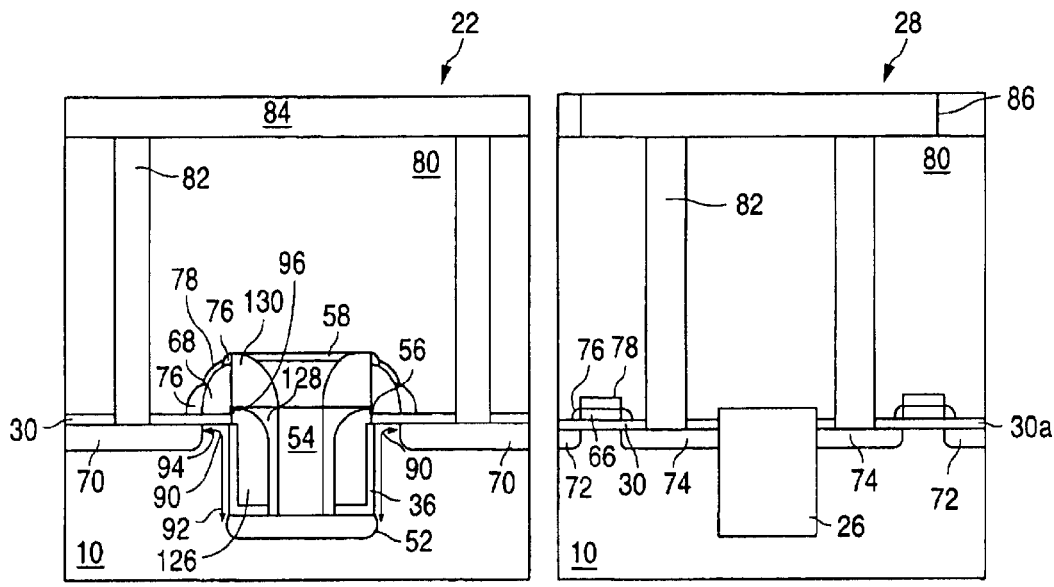

The remaining processing steps described above with respect to FIGS. 2K through 2Q are next performed on the structures shown in FIGS. 8C and 9C, resulting in a final active region memory cell structure illustrated in FIG. 8D, and the final periphery region control circuitry structure illustrated in FIG. 9D. In this embodiment, poly spacers 126 constitute the floating gates, which are insulated from the control gates 68 via oxide 56. By forming the floating gates as spacers, the number and/or complexity of processing steps are reduced. The floating gate spacers 126 each terminate in a sharp edge 96 that directly faces and is insulated from the control gate 68, thus providing a path for Fowler-Nordheim tunneling between the floating gate 126 and the control gate 68.

It is to be understood that the present invention is not limited to the embodiment(s) described above and illustrated herein, but encompasses any and all variations falling within the scope of the appended claims. For example, trenches 20/34 can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material who's etch property differs from that of silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Lastly, single layers of insulating or conductive material could be formed as multiple layers of such materials, and vice versa.

What is claimed is:

1. In an electrically programmable and erasable memory device having a substrate of semiconductor material of a first conductivity type and having a first and second spaced-apart regions formed in the substrate of a second conductivity type, with a non-co-planar channel region formed in the substrate therebetween, wherein said non-co-planar channel region having two portions: a first portion and a second portion, an electrically conductive control gate having a portion disposed adjacent to and insulated from the first portion of the channel region for creating an inversion layer therein, a floating gate having a portion disposed adjacent to and insulated from the second portion of the channel region by an insulator, for creating a depletion region having field lines directed to the floating gate, wherein said first region is adjacent to the inversion layer, a method of programming said device comprises:

creating said inversion layer;

generating a stream of electrons at said first region and causing said stream of electrons to traverse through said inversion layer; and accelerating said stream of electrons through said depletion region by said field lines, with little or no scattering, causing said electrons to be accelerated through said insulator and injected onto the floating gate.

2. The method of claim 1 wherein said channel region has a first portion along a horizontal surface and a second portion in a trench.

3. The method of claim 1 wherein said channel region has a first portion in a trench and a second portion along a horizontal surface.

4. The method of claim 2 wherein said first portion is substantially perpendicular to the second portion.

5. The method of claim 4 wherein said inversion layer having a pinch off point, adjacent to or in said depletion region, and wherein said stream of electrons originates at said pinch off point for acceleration through said depletion region.

* * * * *